(12) United States Patent
Lim et al.

(10) Patent No.: US 12,132,159 B2
(45) Date of Patent: Oct. 29, 2024

(54) LIGHT EMITTING DIODE (LED) PACKAGE AND ILLUMINATING DEVICE INCLUDING THE SAME

(71) Applicant: SAMSUNG ELECTRONICS CO., LTD., Suwon-si (KR)

(72) Inventors: Jongho Lim, Suwon-si (KR); Myoungsu Chae, Hwaseong-si (KR); Yeonjun Sung, Hwaseong-si (KR); Hyongsik Won, Yongin-si (KR); Joonwoo Jeon, Seoul (KR); Soonwon Jeong, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 454 days.

(21) Appl. No.: 17/567,671

(22) Filed: Jan. 3, 2022

(65) Prior Publication Data

US 2022/0223774 A1    Jul. 14, 2022

(30) Foreign Application Priority Data

Jan. 13, 2021    (KR) .................. 10-2021-0004924

(51) Int. Cl.
*H01L 33/50* (2010.01)
*H01L 33/62* (2010.01)
*H05K 1/11* (2006.01)

(52) U.S. Cl.
CPC ............. *H01L 33/62* (2013.01); *H05K 1/111* (2013.01)

(58) Field of Classification Search
CPC ......... H01L 33/50; H01L 33/52; H01L 33/62; H01L 23/00; H01L 23/498; H01L 23/49838; H01L 24/02; H01L 25/075; H01L 25/0753; H05K 1/11; H05K 1/111; H05K 1/05; H05K 1/053
(Continued)

(56) References Cited

U.S. PATENT DOCUMENTS 6,372,608 B1    4/2002 Shimoda et al.
6,645,830 B2    11/2003 Shimoda et al.
(Continued)

FOREIGN PATENT DOCUMENTS

DE    10 2018 101 658 A1    7/2018
KR    10-0523330 B1    10/2005
(Continued)

OTHER PUBLICATIONS

Office Action issued on Dec. 11, 2023 by the German Patent Office in corresponding DE Patent Application No. 102021123709.2.

*Primary Examiner* — Chuong A Luu
(74) *Attorney, Agent, or Firm* — Sughrue Mion, PLLC

(57) ABSTRACT

A light-emitting diode (LED) package includes a package substrate, an LED chip disposed on a first surface of the package substrate, and a first external connection pad and a second external connection pad disposed on a second surface of the package substrate opposite the first surface. The first external connection pad includes a first side, a second side, a third side and a fourth side, the first side being parallel to the second side, and the third side being parallel to the fourth side. The first side is spaced farther from a center of the package substrate than the second side. A length of the first side is shorter than a length of the second side.

10 Claims, 17 Drawing Sheets

(58) Field of Classification Search
USPC .......................................................... 257/99
See application file for complete search history.

(56) References Cited

U.S. PATENT DOCUMENTS

| | | | |
|---|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,064,435 B2 | 6/2006 | Chung et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 9,705,052 B1 | 7/2017 | Lin et al. |
| 10,340,423 B2 | 7/2019 | Chen et al. |
| 10,490,719 B2 | 11/2019 | Yu et al. |
| 10,566,512 B2 | 2/2020 | Mehnert |
| 2012/0181569 A1 | 7/2012 | Choi |
| 2012/0241793 A1 | 9/2012 | In et al. |
| 2014/0252402 A1 | 9/2014 | Lee et al. |
| 2017/0256682 A1 | 9/2017 | Kim et al. |
| 2019/0198737 A1 | 6/2019 | Ikeda |
| 2021/0333635 A1* | 10/2021 | Yang .................... H01L 33/0095 |
| 2022/0209084 A1* | 6/2022 | Takemasa ............... H01L 33/38 |
| 2022/0336525 A1* | 10/2022 | Li .......................... H01L 27/156 |

FOREIGN PATENT DOCUMENTS

| | | |
|---|---|---|
| KR | 10-0633936 B1 | 10/2006 |
| KR | 10-1523527 B1 | 5/2015 |
| KR | 10-1810494 B1 | 12/2017 |

* cited by examiner

LIGHT EMITTING DIODE (LED) PACKAGE AND ILLUMINATING DEVICE INCLUDING THE SAME

CROSS-REFERENCE TO RELATED APPLICATION

This application is based on and claims priority under 35 U.S.C. § 119 to Korean Patent Application No. 10-2021-0004924, filed on Jan. 13, 2021, in the Korean Intellectual Property Office, the disclosure of which is incorporated by reference herein in its entirety.

BACKGROUND

The inventive concept relates to a light-emitting diode (LED) package and an illuminating device including the same.

An LED chip and an LED package including the LED chip have various advantages such as low power consumption, high brightness, and a long lifetime, and thus, their fields of application as light sources are gradually expanding. An example of using an LED package as a light source is an illuminating device for vehicles. Due to the adoption of advanced intelligent automotive illuminating devices such as adaptive front-lighting systems (AFS), head-up displays (HUD), etc., the use of LEDs in vehicles is further increasing.

When the LED package is applied to an illuminating device for a vehicle, mechanical robustness and electrical reliability may be important. Accordingly, various technologies have been studied to improve mechanical robustness and electrical reliability of solders used for connection between the LED package and a printed circuit board on which the LED package is mounted.

SUMMARY

The inventive concept provides a light-emitting diode (LED) package having improved mechanical robustness and electrical reliability and an illuminating device including the LED package.

The objective of the inventive concept is not limited by the above-described one, and other objectives not stated herein will be clearly understood by those skilled in the art from the following description.

According to an aspect of the inventive concept, there is provided a light-emitting diode (LED) package including a package substrate, an LED chip disposed on a first surface of the package substrate, and a first external connection pad and a second external connection pad disposed on a second surface of the package substrate opposite the first surface. The first external connection pad includes a first side, a second side, a third side and a fourth side, the first side being parallel to the second side, and the third side being parallel to the fourth side. The first side is spaced farther from a center of the package substrate than the second side. A length of the first side is shorter than a length of the second side.

According to an aspect of the inventive concept, there is provided a light-emitting diode (LED) package, including a package substrate including a first surface on which an LED chip is disposed, and a first external connection pad and a second external connection pad disposed on a second surface of the package substrate, the first external connection pad and the second external connection pad being electrically connected to the LED chip. The first external connection pad includes a first side, a second side, a third side and a fourth side, a first corner connected to the first side and the third side, the first corner having a round profile, a second corner connected to the first side and the fourth side, the second corner having a round profile, a third corner connected to the second side and the third side, the third corner having a round profile, and a fourth corner connected to the second side and the fourth side, the fourth corner having a round profile. The first side and the second side extend in a first direction. The third side and the fourth side extend in a second direction perpendicular to the first direction. The first side and the second side are respectively longer than the third side and the fourth side. The first corner is spaced farther from a center of the package substrate than the third corner. A radius of the first corner is larger than a radius of the third corner.

According to another aspect of the inventive concept, there is provided a light-emitting diode (LED) package including a package substrate including a first surface on which an LED chip is disposed, and a first external connection pad and a second external connection pad disposed on a second surface of the package substrate, the first external connection pad and the second external connection pad being electrically connected to the LED chip. The first external connection pad includes a first side and a second side extending in a first direction, a third side and a fourth side extending in a second direction perpendicular to the first direction, and a fifth side connected to each of the first side and the third side, the fifth side extending in a direction oblique to each of the first direction and the second direction. The first side is spaced farther from a center of the package substrate than the second side.

According to another aspect of the inventive concept, there is provided a light-emitting diode (LED) package including a package substrate including a first surface on which an LED chip is disposed, and a first external connection pad and a second external connection pad disposed on a second surface of the package substrate, the first external connection pad and the second external connection pad being electrically connected to the LED chip. The first external connection pad includes a first side and a second side extending in a first direction, a third side and a fourth side extending in a second direction perpendicular to the first direction, and a stress relief finger recessed into the first external connection pad from the first side toward the second side. The first side is spaced farther from a center of the package substrate than the second side.

According to another aspect of the inventive concept, there is provided a light-emitting diode (LED) package including a package substrate including a first surface on which an LED chip is disposed, a first external connection pad and a second external connection pad disposed on a second surface of the package substrate, the first external connection pad and the second external connection pad being electrically connected to the LED chip, and a third external connection pad disposed on the second surface of the package substrate, the third external connection pad being electrically insulated from the LED chip. A length of each of the first external connection pad and the second external connection pad in a first direction is longer than a length of each of the first external connection pad and the second external connection pad in a second direction perpendicular to the first direction, a length of the third external connection pad in the first direction is shorter than a length of the third external connection pad in the second direction, and a sum of areas of the first external connection pad and the second external connection pad is in a range of about 0.95 times to about 1.2 times an area of the third external connection pad.

According to another aspect of the inventive concept, there is provided an illuminating device including a printed circuit board (PCB) including a substrate base including aluminum, and a first pad and a second pad disposed on the substrate base, an light-emitting diode (LED) package disposed on the PCB and including a first external connection pad connected to the first pad, and a second external connection pad connected to the second pad, a first solder interposed between the first external connection pad and the first pad, and a second solder interposed between the second external connection pad and the second pad. The PCB further includes a conductive plate disposed inside the substrate base and overlapping the LED package in a first direction perpendicular to an upper surface of the PCB, and a stress relief groove exposing an upper surface of the conductive plate and surrounding the first external connection pad and the second external connection pad in a second direction parallel to the upper surface of the PCB.

BRIEF DESCRIPTION OF THE DRAWINGS

Embodiments of the inventive concept will be more clearly understood from the following detailed description taken in conjunction with the accompanying drawings in which.

DETAILED DESCRIPTION

Figure 1A:
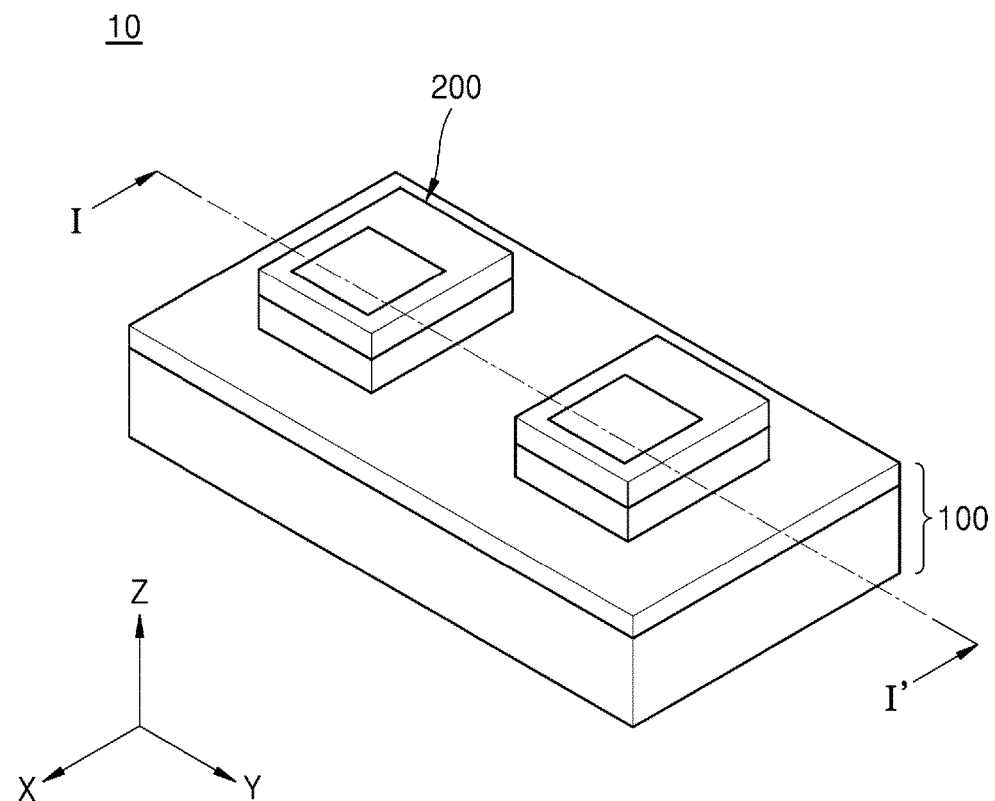
FIG. 1A is a perspective view of an illuminating device including a light-emitting diode (LED) package according to embodiments.

Hereinafter, embodiments of the inventive concept will be described in detail with reference to the attached drawings. In the drawings, like reference numerals are used for like elements, and repeated description thereof may be omitted.

FIG. 1A is a perspective view of an illuminating device 10 including a light-emitting diode (LED) package 200 according to embodiments.

Figure 1B:
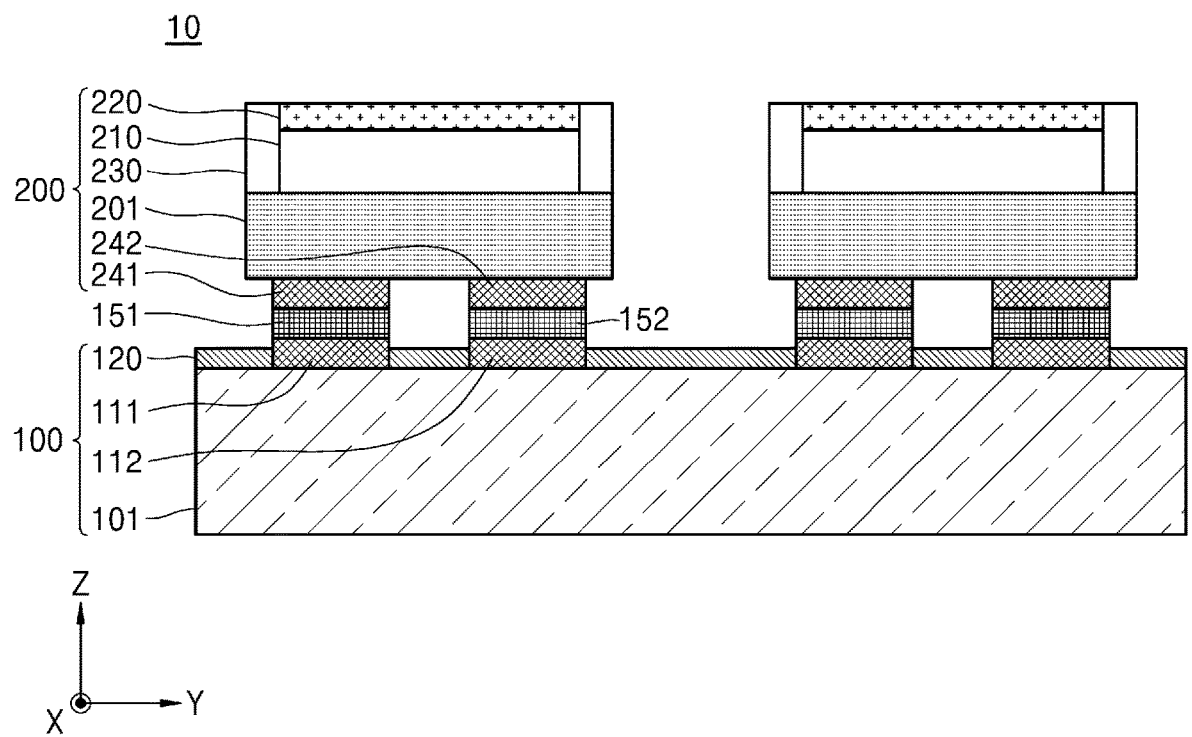
FIG. 1B is a cross-sectional view of the illuminating device taken along line I-I' of FIG. 1A.

FIG. 1B is a cross-sectional view of the illuminating device 10 taken along line I-I' of FIG. 1A.

Referring to FIGS. 1A and 1B, as a non-limiting example, the illuminating device 10 may be a vehicle illuminating device. According to some embodiments, the illuminating device 10 may be a light source outside the vehicle including, for example, a stop signal lamp such as a front turn signal lamp, a mirror mounted side turn signal lamp, a rear turn signal lamp, a center high mounted stop lamp (CHMSL), etc., a head lamp such as a daytime running light (DRL), a high beam lamp, and a low beam lamp, a side marker lamp, a fog lamp, and a license plate lamp. According to other embodiments, the illuminating device 10 may be a light source inside a vehicle including an instrument panel and ambient, reading & dome lights.

According to embodiments, the illuminating device 10 may include a printed circuit board (PCB) 100 and the LED packages 200.

The PCB 100 may be designed by, for example, a surface mounting technique. The PCB 100 may include a substrate base 101, conductive patterns including first and second pads 111 and 112, and an insulating layer 120 surrounding the conductive patterns.

The substrate base 101 may include aluminum. The substrate base 101 including aluminum has a high thermal conductivity, thereby effectively dissipating heat generated by the LED packages 200. Accordingly, the operating temperature of the illuminating device 10 may be reduced, and the life of the illuminating device 10 may be extended. In addition, because a separate radiator is not required, the volume of the illuminating device 10 is greatly reduced, and mechanical strength is excellent. A coefficient of thermal expansion of the substrate base 101 may be about 23.5 parts per million (ppm), but is not limited thereto.

According to embodiments, the conductive pattern including the first and second pads 111 and 112 may include a conductive material such as copper. The insulating layer 120 may include, for example, a photo-sensitive resist. One of a cathode and an anode of the LED package 200 may be connected to the first pad 111, and the other may be connected to the second pad 112.

According to embodiments, the first and second pads 111 and 112 may provide a path for supplying operating power to the LED package 200. According to embodiments, the first and second pads 111 and 112 may provide a path for dissipating heat generated by the LED package 200.

A plurality of LED packages 200 may be mounted on the PCB 100. The plurality of LED packages 200 may be fixed to and connected to the PCB 100 by first and second solders 151 and 152. The first solder 151 may be connected to the first pad 111, and the second solder 152 may be connected to the second pad 112.

Each of the LED packages 200 may generate white light, but is not limited thereto. Each of the LED packages 200 may include a package substrate 201, an LED chip 210, an encapsulant 220, a side reflective layer 230, and external connection pads 241 and 242.

The LED chip 210 may be mounted on the package substrate 201. The package substrate 201 may be, for example, a PCB. In an example, the package substrate 201 may include a metal and/or a metal compound. The package substrate 201 may be, for example, a metal-core PCB (MCPCB), and may include copper (Cu). The package substrate 201 may be a ceramic substrate including, for example, aluminum nitride (AlN).

In another example, the package substrate 201 may be a flexible PCB (FPCB) that is flexible and easily deformable into various shapes. In another example, the package substrate 201 may be a FR4 type PCB, and may include a resin material including epoxy, triazine, silicone, polyimide, etc. or may also include a ceramic material such as silicon nitride, AlN, $Al_2O_3$, etc.

According to embodiments, the package substrate 201 may have a lower coefficient of thermal expansion than the substrate base 101. The coefficient of thermal expansion of the package substrate 201 may be about 4.4 ppm, but is not limited thereto.

Two directions parallel to a lower surface of the package substrate 201 (that is, a surface on which the first and second external connection pads 241 and 242 are formed) and perpendicular to each other are defined as an X direction and the Y direction, respectively, and a direction perpendicular to the lower surface of the package substrate 201 is defined as a Z direction. Unless otherwise stated, definitions of the directions are the same in the following drawings.

According to embodiments, a planar shape of the package substrate 201 may be a rectangle. A pair of sides of the package substrate 201 may be parallel to the X direction and the other pair of sides may be parallel to the Y direction.

According to some embodiments, the LED chip 210 may be mounted on the package substrate 201 in the form of, for example, a flip chip. In this case, solder and bumps interposed between the package substrate 201 and the LED chip 210 may be further provided. According to some other embodiments, the LED chip 210 may be mounted on the package substrate 201 in an epi-up form. In this case, the LED chip 210 may be electrically connected to the package substrate 201 by a bonding wire, and the bonding wire may be molded by the side reflective layer 230. The LED chip 210 may generate blue light, but is not limited thereto.

The LED chip 210 may include a first conductivity type semiconductor layer, an active layer, and a second conductivity type semiconductor layer. According to embodiments, the first conductivity type semiconductor layer may include a single-crystal nitride having a composition of $Al_xIn_yGa_{1-x-y}N$ ($0 \le x \le 1$, $0 \le y \le 1$, and $0 \le x+y \le 1$). The first conductivity type semiconductor layer may include a semiconductor doped with an n-type impurity. According to embodiments, the first conductivity type semiconductor layer may include GaN doped with Si or the like.

The active layer may be arranged on the first conductivity type semiconductor layer. The active layer may emit light having energy via recombination of electrons and holes. According to embodiments, the active layer may include a multiple quantum well (MQW) structure in which quantum well layers and quantum barrier layers are alternately stacked. In this case, a thickness of each of the quantum well layers and the quantum barrier layers may be equal to or greater than 3 nm and equal to or less than 10 nm. According to embodiments, the MQW structure may include a multiple stack structure of InGaN and GaN. However, the inventive concept is not limited thereto, and according to embodiments, the active layer may include a single quantum well (SQW) structure.

The second conductivity type semiconductor layer may include a single-crystal nitride having a composition of $Al_xIn_yGa_{1-x-y}N$ ($0 \le x \le 1$, $0 \le y \le 1$, and $0 \le x+y \le 1$) doped with a p-type impurity. A p-type impurity may include, for example, Mg, but is not limited thereto.

The encapsulant 220 may be disposed on the LED chip 210. The encapsulant 220 may contact the LED chip 210. According to embodiments, the encapsulant 220 may be a film in which a fluorescent material is mixed with a transparent resin such as Si. According to embodiments, the encapsulant 220 may reduce color dispersion of light generated by the LED chip 210. According to embodiments, the encapsulant 220 may convert blue light generated by the LED chip 210 into white light, but is not limited thereto.

According to embodiments, the side reflective layer 230 may cover side surfaces of the LED chip 210 and the encapsulant 220. The side reflective layer 230 may prevent the LED chip 210 from emitting light in a direction other than a designed direction, and thus the luminous efficiency of the illuminating device 10 may be improved. The side reflective layer 230 may include a material having high reflectivity. The side reflective layer 230 may include white resin. The white resin may be, for example, a Si resin to which $TiO_2$ is added, but is not limited thereto.

The LED package 200 may include a first external connection pad 241 and a second external connection pad 242. The first external connection pad 241 may be configured to be electrically connected to the first pad 111 through the first solder 151. The second external connection pad 242 may be configured to be electrically connected to the second pad 112 through the second solder 152. One of the first external connection pad 241 and the second external connection pad 242 may be a cathode of the LED package 200, and the other may be an anode of the LED package 200. One of the first external connection pad 241 and the second external connection pad 242 may be configured to be electrically connected to the first conductivity type semiconductor layer of the LED chip 210, and the other may be configured to be electrically connected to the second conductivity type semiconductor layer.

Figure 2A:
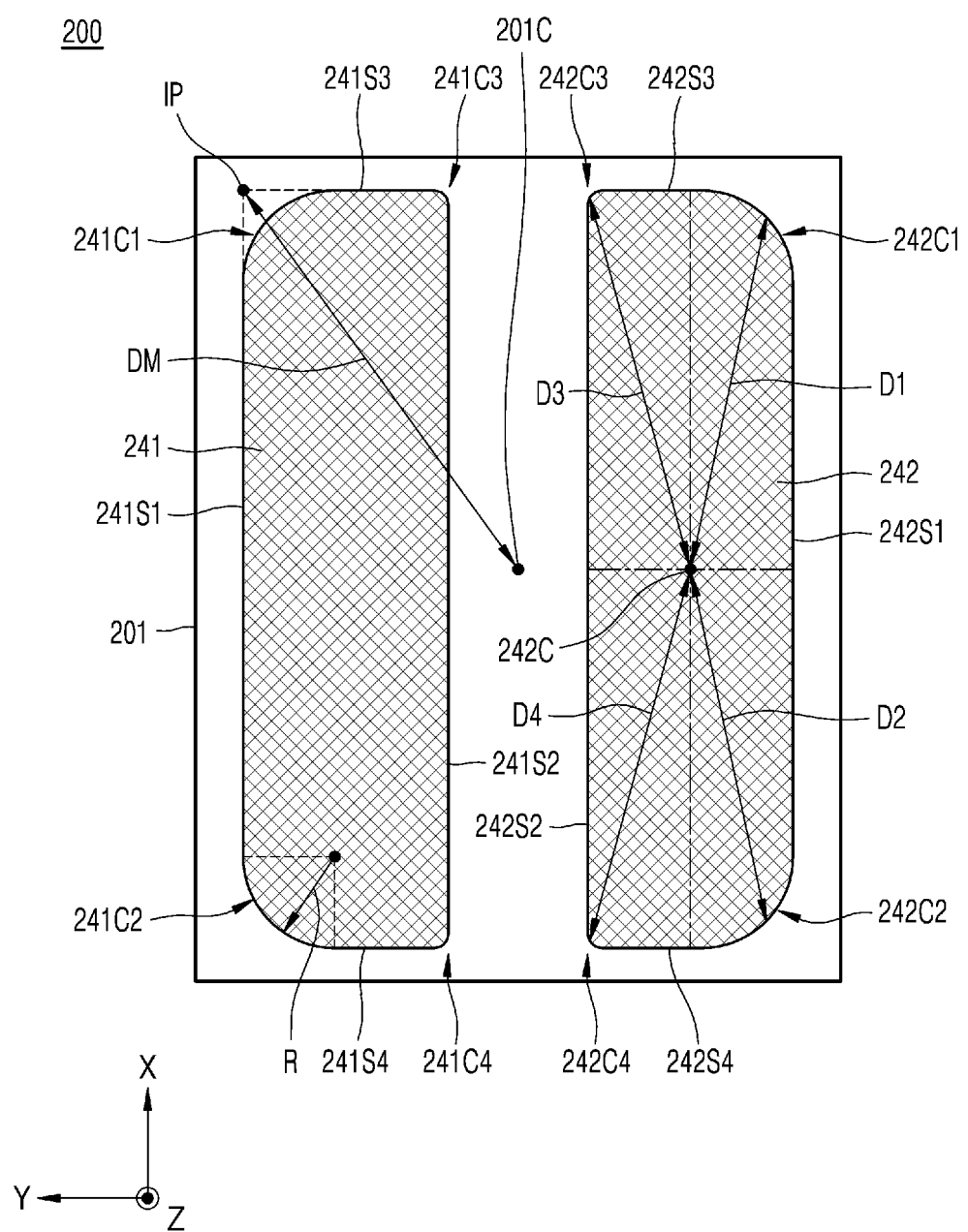
FIG. 2A is a plan view illustrating a lower surface of an LED package according to embodiments.

FIG. 2A is a plan view illustrating a lower surface of the LED package 200 according to embodiments.

Referring to FIG. 2A, lengths of sides parallel to the X direction of a lower surface of the package substrate 201 may be greater than lengths of sides of a lower surface of the package substrate 201 parallel to the Y direction.

According to embodiments, the first and second external connection pads 241 and 242 may be symmetric to each other with respect to an axis passing through a center 201C of the lower surface of the package substrate 201 and parallel to the X direction. Each of the first and second external connection pads 241 and 242 may be symmetric with respect to an axis passing through the center 201C of the lower surface of the package substrate 201 and parallel to the Y direction.

Each of the first and second external connection pads 241 and 242 may have a substantially rectangular planar shape. A length of each of the first and second external connection pads 241 and 242 in the X direction may be greater than a length of each of the first and second external connection pads 241 and 242 in the Y direction.

According to embodiments, the first external connection pad 241 may include first to fourth sides 241S1, 241S2, 241S3, and 241S4 and first to fourth corners 241C1, 241C2, 241C3, and 241C4.

According to embodiments, the first and second sides 241S1 and 241S2 may be parallel to the X direction. The first side 241S1 may be spaced farther from the center 201C than the second side 241S2. The length of the first side 241S1 may be shorter than the length of the second side 241S2.

According to embodiments, the third and fourth sides 241S3 and 241S4 may be parallel to the Y direction. The length of the third side 241S3 may be substantially the same as the length of the fourth side 241S4.

The first corner 241C1 may be interposed between the first side 241S1 and the third side 241S3. The first corner 241C1 may be connected to each of the first side 241S1 and the third side 241S3. The second corner 241C2 may be interposed between the first side 241S1 and the fourth side 241S4. The second corner 241C2 may be connected to each of the first side 241S1 and the fourth side 241S4. The third corner 241C3 may be interposed between the second side 241S2 and the third side 241S3. The third corner 241C3 may be connected to each of the second side 241S2 and the third side 241S3. The fourth corner 241C4 may be interposed between the second side 241S2 and the fourth side 241S4. The fourth corner 241C4 may be connected to each of the second side 241S2 and the fourth side 241S4.

Each of the first to fourth corners 241C1, 241C2, 241C3, and 241C4 may have a round profile. According to embodiments, each of the first and second corners 241C1 and 241C2 may have an intentionally formed round profile, and each of the third and fourth corners 241C3 and 241C4 may have a round profile accompanied by a characteristic of a patterning process.

According to embodiments, a radius R of each of the first and second corners 241C1 and 241C2 may be larger than a radius of each of the third and fourth corners 241C3 and 241C4. According to embodiments, the radius R of each of the first and second corners 241C1 and 241C2 may be equal to or greater than about 2 times the radius of each of the third and fourth corners 241C3 and 241C4. According to embodiments, the radius R of each of the first and second corners 241C1 and 241C2 may be equal to or greater than about 5 times the radius of each of the third and fourth corners 241C3 and 241C4. According to embodiments, the radius R of each of the first and second corners 241C1 and 241C2 may be equal to or less than about 10 times the radius of each of the third and fourth corners 241C3 and 241C4.

According to embodiments, the radius R of each of the first and second corners 241C1 and 241C2 may depend on a distance DM between an intersection point IP of an extension line of the first side 241S1 and an extension line of the third side 241S3 and the center 201C. According to embodiments, the radius R of each of the first and second corners 241C1 and 241C2 may be in the range of about 0.2 times to about 0.5 times the distance DM between the intersection point IP and the center 201C.

According to embodiments, the radius R of each of the first and second corners 241C1 and 241C2 may be in the range of about 100 μm to about 500 μm. According to embodiments, the radius of each of the third and fourth corners 241C3 and 241C4 may be in the range of about 10 μm to about 100 μm.

According to embodiments, the second external connection pad 242 may include first to fourth sides 242S1, 242S2, 242S3, and 242S4 and first to fourth corners 242C1, 242C2, 242C3, and 242C4.

Connection relationships and geometric and dimensional characteristics described above with respect to the first to fourth sides 241S1, 241S2, 241S3, and 241S4 and the first to fourth corners 241C1, 241C2, 241C3, and 241C4 may be similarly applied to the first to fourth sides 242S1, 242S2, 242S3, and 242S4 and the first to fourth corners 242C1, 242C2, 242C3, and 242C4, and thus redundant descriptions thereof may be omitted.

A first distance D1 that is a distance between a center 242C of the second external connection pad 242 and the first corner 242C1 and a second distance D2 that is a distance between the center 242C and the second corner 242C2 may be respectively greater than a third distance D3 that is a distance between the center 242C and the third corner 242C3 and a fourth distance D4 that is a distance between the center 242C and the fourth corner 242C4. Accordingly, the second external connection pad 242 may have an asymmetric shape with respect to an axis passing through the center 242C of the second external connection pad 242 and parallel to the X direction. Here, the center 242C of the second external connection pad 242 may be a midpoint of both ends of the second external connection pad 242 in the X direction and a midpoint of both ends of the second external connection pad 242 in the Y direction.

Due to the symmetry between the first and second external connection pads 241 and 242, a distance between the center of the first external connection pad 241 and each of the first to fourth corners 241C1, 241C2, 241C3, and 241C4 is similar to that described with respect to the second external connection pad 242.

In the case of an illuminating device of the related art, due to a difference in the coefficient of thermal expansion between a package substrate of an LED package and a PCB on which the LED package is mounted, there is a problem in that a defect such as a crack occurs in a solder connecting the package substrate of the LED package and the PCB. Such a crack occurs by stress due to a difference in the coefficient of thermal expansion, and the stress increases as a distance from the center of the package substrate increases.

According to embodiments, the first and second corners 241C1 and 241C2 of the first external connection pad 241 and the first and second corners 242C1 and 242C2 of the second external connection pad 242 have the relatively large radius R, thereby reducing a maximum distance between the first external connection pad 241 and the center 201C and a maximum distance between the second external connection pad 242 and the center 201C. Accordingly, stress applied to the first and second solders 151 and 152 (see FIG. 1B) may be relieved, defects in the first and second solders 151 and 152 may be reduced, and reliability of the illuminating device 10 may be improved.

Here, the maximum distance between the first external connection pad 241 and the center 201C means a distance between a part of the first external connection pad 241 that is the farthest from the center 201C and the center 201C.

When the radius R is too large, an area of the first and second external connection pads 241 and 242 decreases, and thus an operating temperature of the LED package 200 may increase, which may cause a decrease in the product life of the illuminating device 10 (see FIG. 1A). According to embodiments, the radius R is equal to or less than about 0.5 times the distance DM between the intersection point IP and the center 201C, thereby preventing the life of the LED package 200 from being shortened.

Figure 2B:
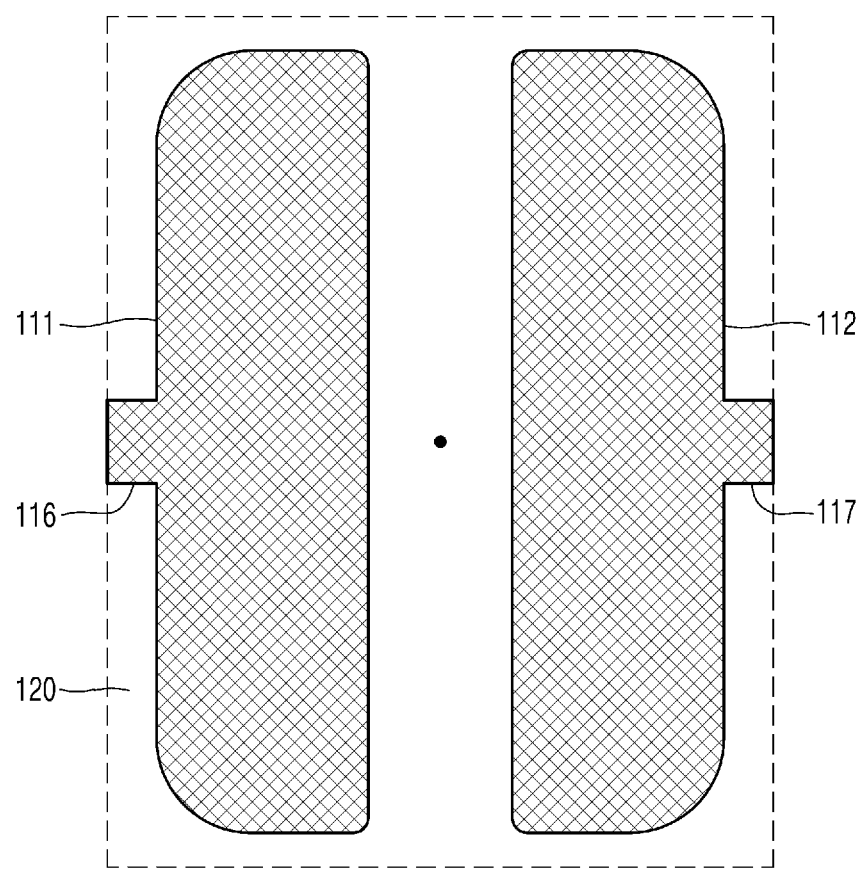
FIG. 2B is a partial plan view illustrating a part of a printed circuit board (PCB) according to embodiments.

FIG. 2B is a partial plan view illustrating a part of the PCB 100 according to embodiments. More specifically, FIG. 2B shows a mounting portion 100M of the PCB 100 on which the LED package 200 (see FIG. 2) is mounted.

Referring to FIGS. 2A and 2B, first and second pads 111 and 112, a first connecter 116 connected to the first pad 111, and a second connecter 118 connected to the second pad 112 may be provided in the mounting portion 100M of the PCB 100.

The first pad 111 may have substantially the same planar shape as the first external connection pad 211, and the second pad 112 may have substantially the same planar shape as the second external connection pad 212. According to embodiments, the first and second pads 111 and 112 having shapes similar to those of the first and second external connection pads 211 and 212 are provided, thereby relieving stress applied to the first and second solders 151 and 152 (see FIG. 1B) and simultaneously preventing the life of the LED package 200 (see FIG. 1B) from being shortened.

An embodiment in which the first and second pads 111 and 112 have respectively shapes similar to those of the first and second external connection pads 241 and 242 of FIG. 2A is described with reference to FIG. 2B, but this is an example, and the scope of the inventive concept is not limited thereto. Those of ordinary skill in the art, based on the description herein, may easily reach embodiments in which the first and second pads 111 and 112 have the same shapes as first and second external connection pads shown in FIGS. 3A to 3F respectively and embodiments in which three external connection pads having shapes corresponding to the first to third external connection pads shown in FIGS. 3G to 3J are formed on the mounting portion 100M of the PCB 100.

Figure 3A:
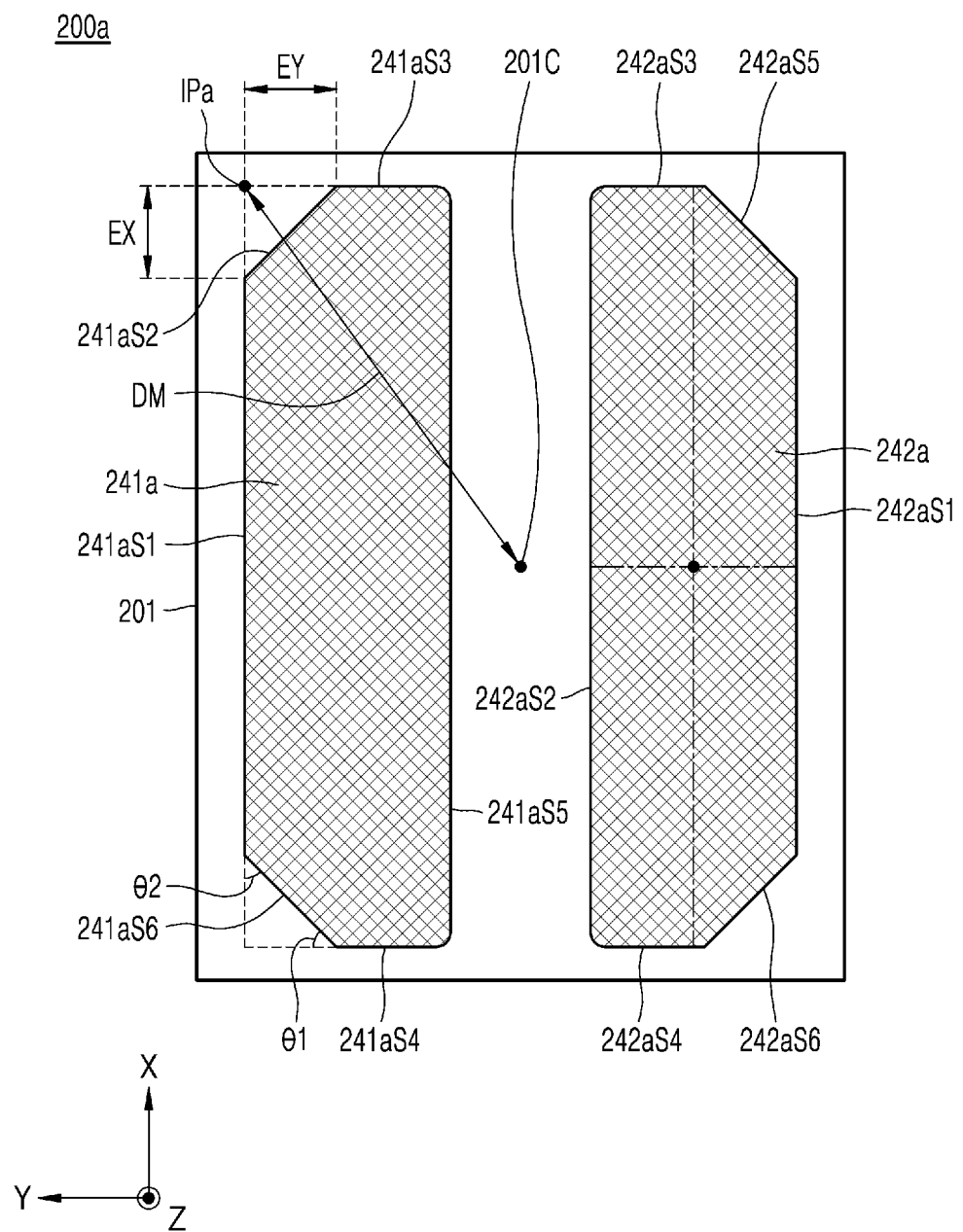
FIGS. 3A, 3B, 3C, 3D, 3E, 3F, 3G, 3H, 3I and 3J are plan views illustrating LED packages according to other embodiments.

FIG. 3A is a plan view illustrating an LED package 200a according to other embodiments. More specifically, FIG. 3A shows a part corresponding to FIG. 2A.

Referring to FIG. 3A, the LED package 200a may include first and second external connection pads 241a and 242a formed on a lower surface of the package substrate 201. In addition, the LED package 200a may further include the package substrate 201, the LED chip 210, the encapsulant 220, and the side reflective layer 230 shown in FIG. 1B.

According to embodiments, the first and second external connection pads 241a and 242a may be symmetric to each other with respect to an axis passing through the center 201C of the lower surface of the package substrate 201 and parallel to the X direction. Each of the first and second external connection pads 241a and 242a may be symmetric with respect to an axis passing through the center 201C of the lower surface of the package substrate 201 and parallel to the Y direction.

A length of each of the first and second external connection pads 241a and 242a in the X direction may be greater than a length thereof in the Y direction. The first external connection pad 241a may include first to sixth sides 241aS1, 241aS2, 241aS3, 241aS4, 241aS5, and 241aS6, and the second external connection pad 242a may include first to sixth sides 242aS1, 242aS2, 242aS3, 242aS4, 242aS5, and 242aS6.

According to embodiments, the first and second sides 241aS1 and 241aS2 may be parallel to the X direction. The first side 241aS1 may be spaced farther from the center 201C than the second side 241aS2. The length of the first side 241aS1 may be shorter than the length of the second side 241aS2.

According to embodiments, the third and fourth sides 241aS3 and 241aS4 may be parallel to the Y direction. The length of the third side 241aS3 may be substantially the same as the length of the fourth side 241aS4.

According to embodiments, the fifth side 241aS5 may be interposed between the first side 241aS1 and the third side 241aS3. The fifth side 241aS5 may be connected to each of the first side 241aS1 and the third side 241aS3. The fifth side 241aS5 may extend in a direction oblique to each of the X and Y directions.

The sixth side 241aS6 may be interposed between the first side 241aS1 and the fourth side 241aS4. The sixth side 241aS6 may be connected to each of the first side 241aS1 and the fourth side 241aS4. The sixth side 241aS6 may extend in a direction oblique to each of the X and Y directions.

An intersection point IPa is defined as an intersection point between extension lines of each of the first and third sides 241aS1 and 241aS3 similarly to FIG. 2A. In addition, an X-direction distance between one end of the fifth side 241aS5 (that is, an intersection of the third and fifth sides 241aS3 and 241aS5) and the intersection point IPa is defined as a first exclusion width EX, and a Y-direction distance between the other end of the fifth side 241aS5 (that is, an intersection of the first and fifth sides 241aS1 and 241aS5) and the intersection point IPa is defined as a second exclusion width EY. The first and second exclusion widths EX and EY with respect to the sixth side 241aS6 are similarly defined.

According to embodiments, each of the first and second exclusion widths EX and EY may be in the range of about 0.2 to about 0.5 times the distance DM between the center 201C of the package substrate 201 and the intersection point IPa. Accordingly, the first external connection pad 241a may have a shape in which some of approximately rectangular corners are removed by chamfering.

According to embodiments, the first and second exclusion widths EX and EY may be substantially the same as each other. In this case, a first angle θ1 that is an angle between the sixth side 241aS6 and the Y direction may be substantially the same as a second angle θ2 that is an angle between the sixth side 241aS6 and the X direction. According to some other embodiments, the first and second exclusion widths EX and EY may be different from each other. In this case, the first angle θ1 may be different from the second angle θ2.

According to embodiments, due to the formation of the fifth and sixth sides 241aS5 and 241aS6, the first external connection pad 241a may have an asymmetric shape with respect to an axis passing through a center of the first external connection pad 241a and parallel to the X direction.

Connection relationships and geometrical and dimensional characteristics described above with respect to the first to sixth sides 241aS1, 241aS2, 241aS3, 241aS4, 241aS5, and 241aS6 of the first external connection pad 241a may be similarly applied to the first to sixth sides 242aS1, 242aS2, 242aS3, 242aS4, 242aS5, and 242aS6 of the connection second external pad 242a, and thus redundant descriptions thereof may be omitted.

According to embodiments, a maximum distance from the center 201C of the package substrate 201 with respect to each of the first and second external connection pads 241a and 242a may be reduced, thereby relieving stress applied to the first and second solders 151 and 152 (see FIG. 1B), and continuously preventing the life of the LED package 200a from being shortened due to an increase in the operating temperature of the LED package 200a.

Figure 3B:
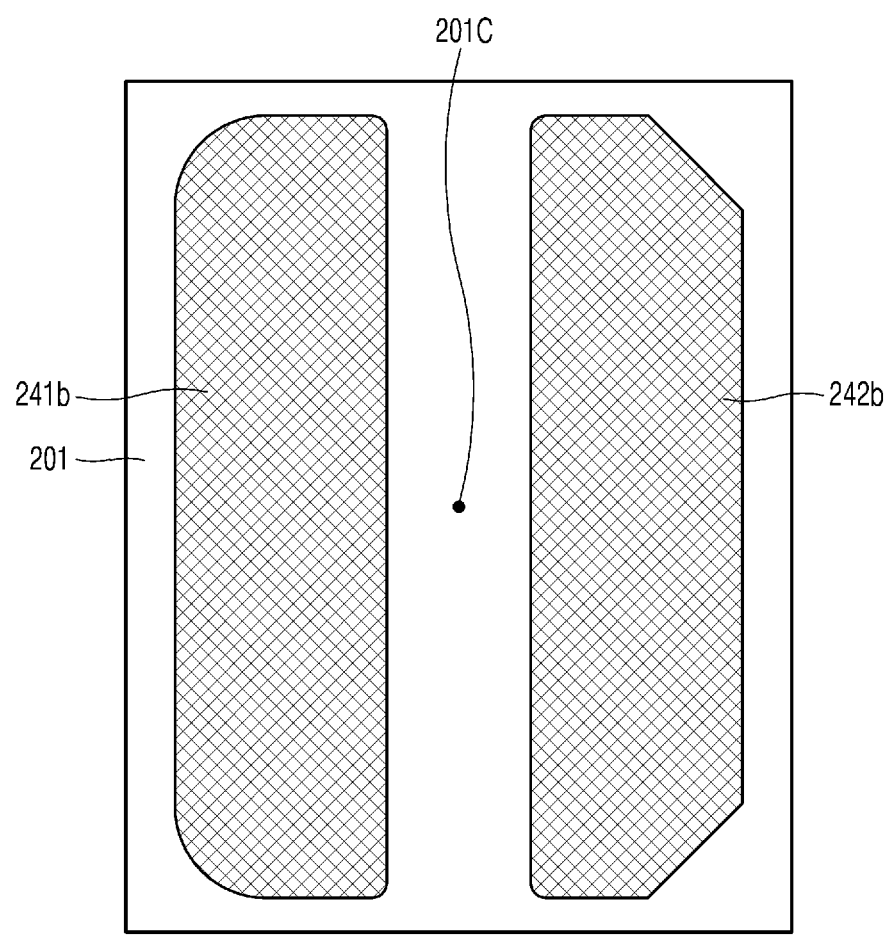

FIG. 3B is a plan view illustrating an LED package 200b according to other embodiments.

For convenience of description, redundant descriptions with those described with reference to FIGS. 1A to 3A may be omitted, and differences will be mainly described.

Referring to FIG. 3B, the LED package 200b may include first and second external connection pads 241b and 242b formed on a lower surface of the package substrate 201. In addition, the LED package 200b may further include the package substrate 201, the LED chip 210, the encapsulant 220, and the side reflective layer 230 shown in FIG. 1B.

According to embodiments, the first external connection pad 241b may have a different planar shape than the second external connection pad 242b. According to embodiments, the first external connection pad 241b may have a planar shape similar to the first external connection pad 241 of FIG. 2A, and the second external connection pad 242b may have a planar shape similar to the second external connection pad 242a of FIG. 3A.

According to embodiments, the first and second external connection pads 241b and 242b may have an asymmetric shape with respect to an axis passing through the center 201C of the package substrate 201 and parallel to the X direction. According to embodiments, the first external connection pad 241b may have a symmetric planar shape with respect to an axis passing through the center 201C of the package substrate 201 and parallel to the Y direction. According to embodiments, the second external connection pad 242*b* may have a symmetric planar shape with respect to an axis passing through the center 201C of the package substrate 201 and parallel to the Y direction.

Figure 3C:
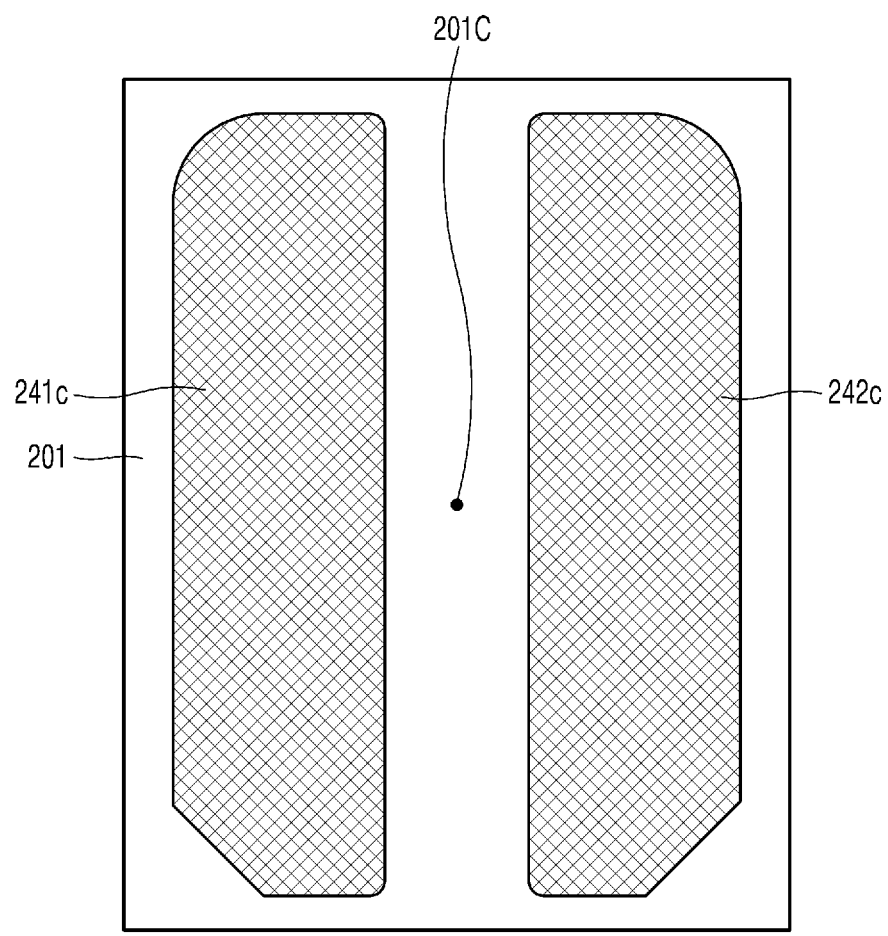

FIG. 3C is a plan view illustrating an LED package 200*c* according to other embodiments.

For convenience of description, redundant descriptions with those described with reference to FIGS. 1A to 3A may be omitted, and differences will be mainly described.

Referring to FIG. 3C, the LED package 200*c* may include first and second external connection pads 241*c* and 242*c* formed on a lower surface of the package substrate 201. In addition, the LED package 200*c* may further include the package substrate 201, the LED chip 210, the encapsulant 220, and the side reflective layer 230 shown in FIG. 1B.

According to embodiments, the first and second external connection pads 241*c* and 242*c* may be symmetric to each other with respect to an axis passing through a center 201C of the lower surface of the package substrate 201 and parallel to the X direction. According to embodiments, the first external connection pad 241*c* may have an asymmetric planar shape with respect to an axis passing through the center 201C of the package substrate 201 and parallel to the Y direction. According to embodiments, the second external connection pad 242*c* may have an asymmetric planar shape with respect to an axis passing through the center 201C of the package substrate 201 and parallel to the Y direction.

According to embodiments, an upper portion of each of the first and second external connection pads 241*c* and 242*c* may include round corners of relatively large radius, similarly to the first and second external connection pads 241 and 242 of FIG. 2A. According to embodiments, a lower portion of each of the first and second external connection pads 241*c* and 242*c* may have a chamfered shape similarly to the first and second external connection pads 241*a* and 242*a* of FIG. 3A.

Figure 3D:
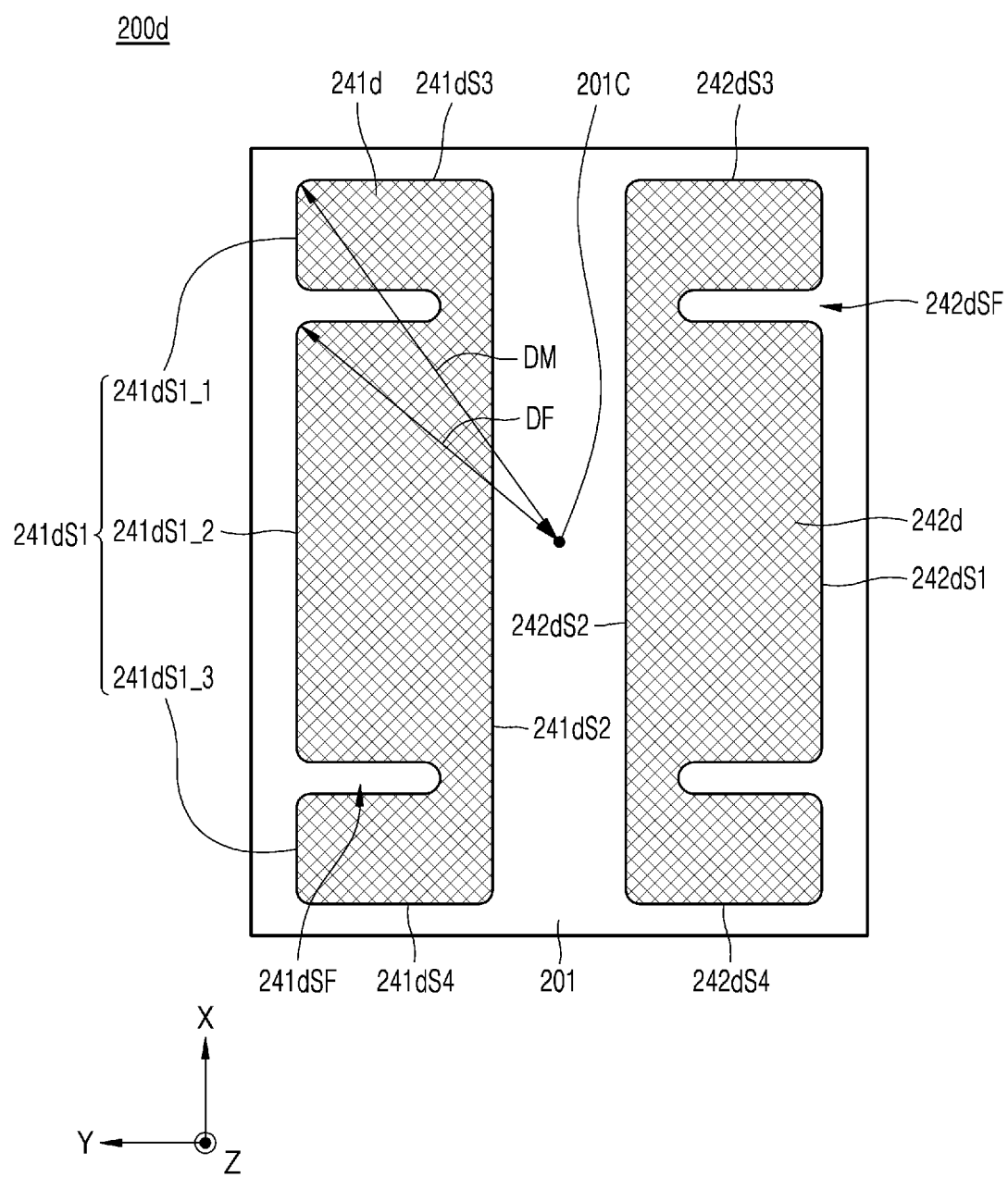

FIG. 3D is a plan view illustrating an LED package 200*d* according to other embodiments.

For convenience of description, redundant descriptions with those described with reference to FIGS. 1A to 3A may be omitted, and differences will be mainly described.

Referring to FIG. 3D, the LED package 200*d* may include first and second external connection pads 241*d* and 242*d* formed on a lower surface of the package substrate 201. In addition, the LED package 200*b* may further include the package substrate 201, the LED chip 210, the encapsulant 220, and the side reflective layer 230 shown in FIG. 1B.

According to embodiments, each of the first and second external connection pads 241*d* and 242*d* may have a substantially rectangular planar shape. A length of each of the first and second external connection pads 241*d* and 242*d* in the X direction may be greater than a length thereof in the Y direction.

According to embodiments, the first external connection pad 241*d* may include first to fourth sides 241*d*S1, 241*d*S2, 241*d*S3, and 241*d*S4. Each of the first and second sides 241*d*S1 and 241*d*S2 may be parallel to the X direction. The first side 241*d*S1 may be spaced farther from the center 201C than the second side 241*d*S2.

According to embodiments, the third and fourth sides 241*d*S3 and 241*d*S4 may be parallel to the Y direction. The length of the third side 241*d*S3 may be substantially the same as the length of the fourth side 241*d*S4.

According to embodiments, a first external connection pad 241*d* may include first stress relief fingers 241*d*SF recessed from the first side 241*d*S1 toward the second side 241*d*S2. According to embodiments, the distance DM between an intersection point of the first and third sides 241*d*S1 and 241*d*S3 and a center 201C of the package substrate 201 may be equal to or greater than about 1.5 mm. According to embodiments, a distance DF between a part on the first side 241*d*S1 where the first stress relief fingers 241*d*SF start and the center 201C of the package substrate 201 may be in the range of about 0.5 times to about 0.8 times the distance DM.

Due to the formation of the first stress relief fingers 241*d*SF, the first side 241*d*S1 may be divided into three portions 241*d*S1_1, 241*d*S1_2, and 241*d*S1_3. The sum of lengths of the three portions 241*d*S1_1, 241*d*S1_2, and 241*d*S1_3 may be smaller than a length of the second side 241*d*S2.

The length of the first stress relief fingers 241*d*SF in the Y direction may be shorter than the length of each of the third and fourth sides 241*d*S3 and 241*d*S4 in the Y direction. Accordingly, because the first external connection pad 241*d* is not separated by the first stress relief fingers 241*d*SF, the first external connection pad 241*d* may include only a single continuous element.

According to embodiments, the second external connection pad 242*d* may include first to fourth sides 242*d*S1, 242*d*S2, 242*d*S3, 242*d*S4 and second stress relief fingers 242*d*SF formed on the first side 242*d*S1.

According to embodiments, the first and second external connection pads 241*d* and 242*d* may be symmetric to each other with respect to an axis passing through the center 201C of the package substrate 201 and parallel to the X direction. Accordingly, connection relationships and geometric characteristics, and dimensional characteristics described above with respect to the first to fourth sides 241*d*S1, 241*d*S2, 241*d*S3, 241*d*S4 and the first stress relief fingers 241*d*SF may be similarly applied to the first to fourth sides 242*d*S1, 242*d*S2, 242*d*S3, and 242*d*S4 and the second stress relief fingers 242*d*SF, and thus redundant descriptions thereof may be omitted.

When the distance DM between the intersection point of the first and third sides 241*d*S1 and 241*d*S3 and the center 201C of the package substrate 201 is equal to or greater than 1.5 mm, a stress relaxation effect may be insufficient only by forming corners of a round profile having a large radius in the first and second external connection pads 241 and 242 as shown in FIG. 2A, or providing the first and second external connection pads 241*a* and 242*a* having a chamfered shape as shown in FIG. 3A. The first and second external connection pads 241*d* and 242*d* according to embodiments include the first and second stress relief fingers 241*d*SF and 242*d*SF capable of reducing stress due to a difference in thermal expansion coefficient, thereby relieving stress applied to the first and second solders 151 and 152 (see FIG. 1B), and improving reliability of the illuminating device 10 (see FIG. 1B).

Figure 3E:
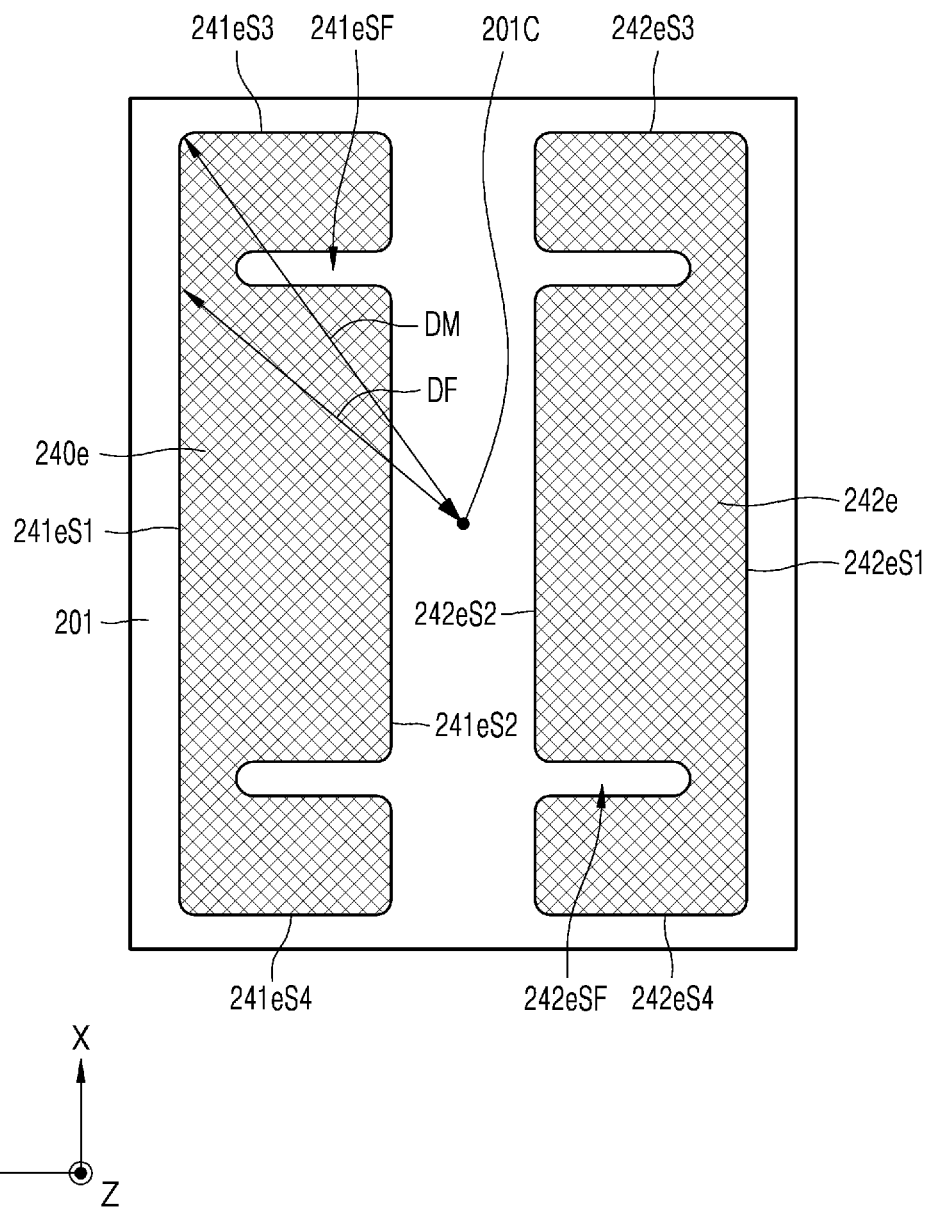

FIG. 3E is a plan view illustrating an LED package 200*e* according to other embodiments.

For convenience of description, redundant descriptions with those described with reference to FIG. 3D may be omitted, and differences will be mainly described.

Referring to FIG. 3E, the LED package 200*e* may include first and second external connection pads 241*e* and 242*e* formed on a lower surface of the package substrate 201. In addition, the LED package 200*e* may further include the package substrate 201, the LED chip 210, the encapsulant 220, and the side reflective layer 230 shown in FIG. 1B.

According to embodiments, each of the first and second external connection pads 241*e* and 242*e* may have a substantially rectangular planar shape. A length of each of the first and second external connection pads 241e and 242e in the X direction may be greater than the length thereof in the Y direction.

According to embodiments, the first external connection pad 241e may include first to fourth sides 241eS1, 241eS2, 241eS3 and 241eS4. Each of the first and second sides 241eS1 and 241eS2 may be parallel to the X direction. The first side 241eS1 may be spaced farther from the center 201C than the second side 241eS2.

The second external connection pad 242e may include first to fourth sides 242eS1, 242eS2, 242eS3, and 242eS4. Each of the first and second sides 242eS1 and 242eS2 may be parallel to the X direction. The first side 242eS1 may be spaced farther from the center 201C than the second side 242eS2.

According to embodiments, the first and second external connection pads 241e and 242e are similar to the first and second external connection pads 241d and 242d of FIG. 3D while the first stress relief fingers 241eSF may be formed on the second side 241eS2, and the second stress relief fingers 242eSF may be formed on the second side 242eS2.

According to embodiments, the distance DM between an intersection point of the first and third sides 241eS1 and 241eS3 and the center 201C may be equal to or greater than about 1.5 mm. According to embodiments, the distance DF between a point on the first side 241eS1 facing ends of the first stress relief fingers 241eSF and the center 201C of the package substrate 201 may be in the range of about 0.5 times to about 0.8 times the distance DM.

Figure 3F:
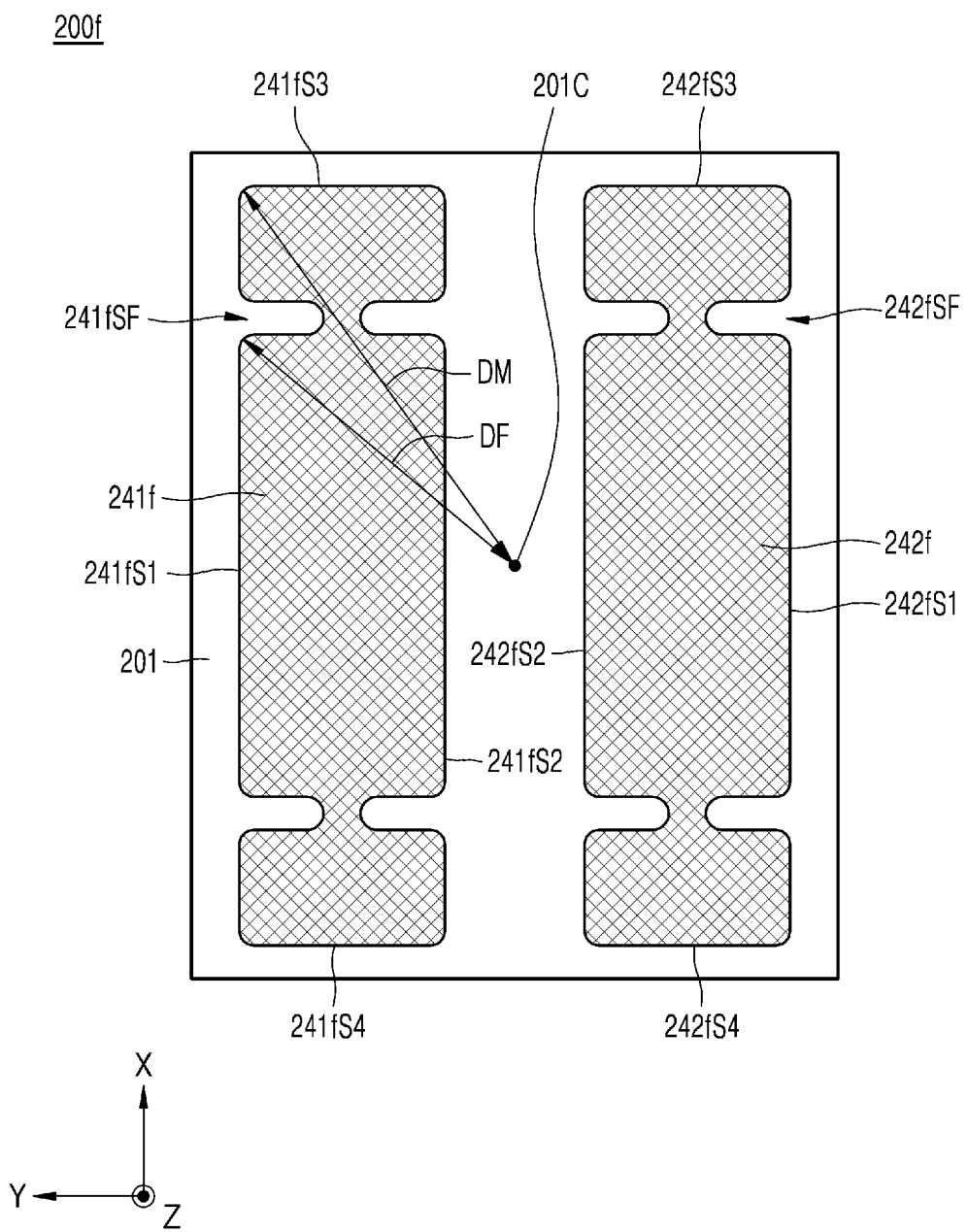

FIG. 3F is a plan view illustrating an LED package 200f according to other embodiments.

For convenience of description, redundant descriptions with those described with reference to FIGS. 3D and 3E may be omitted, and differences will be mainly described.

Referring to FIG. 3F, the LED package 200f may include first and second external connection pads 241f and 242f formed on a lower surface of the package substrate 201. In addition, the LED package 200f may further include the package substrate 201, the LED chip 210, the encapsulant 220, and the side reflective layer 230 shown in FIG. 1B.

According to embodiments, each of the first and second external connection pads 241f and 242f may have a substantially rectangular planar shape. A length of each of the first and second external connection pads 241f and 242f in the X direction may be greater than a length thereof in the Y direction.

According to embodiments, the first external connection pad 241f may include first to fourth sides 241fS1, 241fS2, 241fS3 and 241fS4. Each of the first and second sides 241fS1 and 241fS2 may be parallel to the X direction. The first side 241fS1 may be spaced farther from the center 201C than the second side 241fS2.

The second external connection pad 242f may include first to fourth sides 242fS1, 242fS2, 242fS3, and 242fS4. Each of the first and second sides 242fS1 and 242fS2 may be parallel to the X direction. The first side 242fS1 may be spaced farther from the center 201C than the second side 242fS2.

According to embodiments, the first and second external connection pads 241f and 242f are similar to the first and second external connection pads 241d and 242d of FIG. 3D while the first stress relief fingers 241fSF may be formed on each of the first and second sides 241fS1 and 241fS2, and the second stress relief fingers 242fSF may be formed on each of the first and second sides 242fS1 and 242fS2.

According to embodiments, the distance DM between an intersection point of the first and third sides 241fS1 and 241fS3 and the center 201C may be equal to or greater than about 1.5 mm. According to embodiments, the distance DF between a point on the first side 241fS1 where the first stress relief fingers 241fSF are formed and the center 201C of the package substrate 201 may be in the range of about 0.5 times to about 0.8 times the distance DM.

Figure 3G:
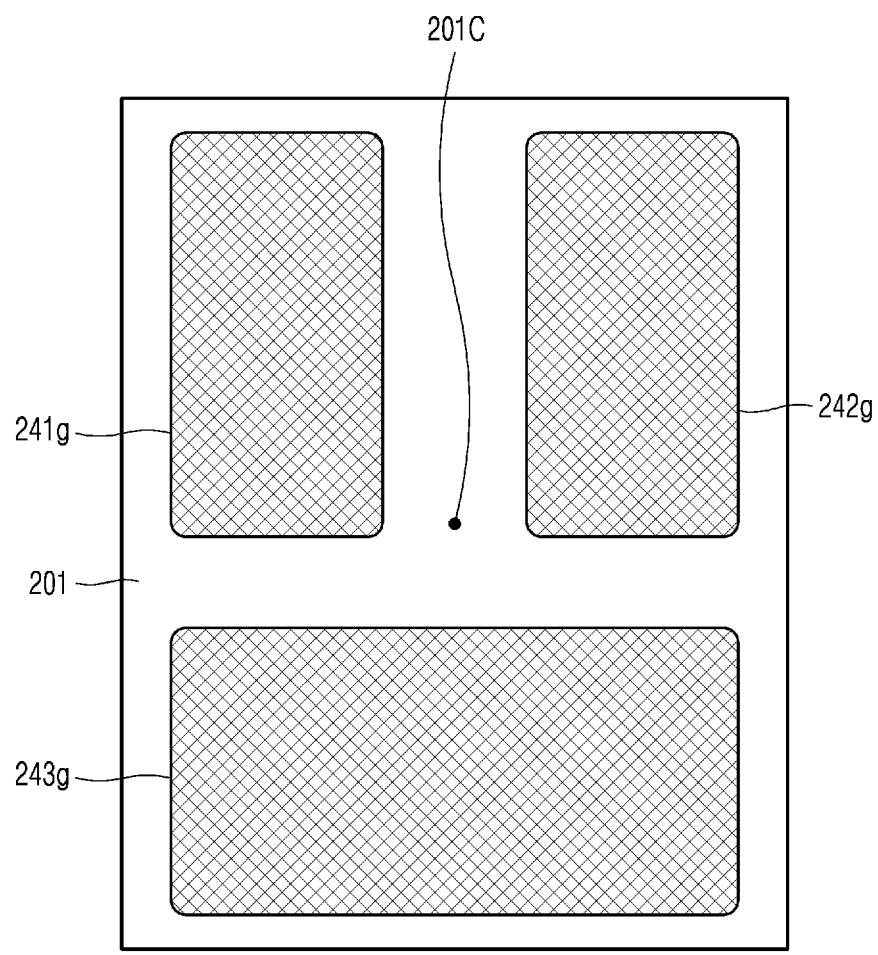

FIG. 3G is a plan view illustrating an LED package 200g according to other embodiments.

For convenience of description, redundant descriptions with those described with reference to FIGS. 1A to 3A may be omitted, and differences will be mainly described.

Referring to FIG. 3G, the LED package 200g may include first to third external connection pads 241g, 242g, and 243g formed on a lower surface of the package substrate 201. In addition, the LED package 200g may further include the package substrate 201, the LED chip 210, the encapsulant 220, and the side reflective layer 230 shown in FIG. 1B.

The LED package 200g may be a 3-pad package. One of first and second conductivity type semiconductor layers of the LED chip 210 (see FIG. 1B) may be connected to the first external connection pad 241g, and the other may be connected to the second external connection pad 242g. The third external connection pad 243g may be a heat dissipation pad. The third external connection pad 243g may be floated. The third external connection pad 243g may be insulated from each of the first and second conductivity type semiconductor layers of the LED chip 210 (see FIG. 1B).

According to embodiments, each of the first to third external connection pads 241g, 242g, and 243g may have a substantially rectangular planar shape. A length of each of the first and second external connection pads 241g and 242g in the X direction may be greater than a length of each of the first and second external connection pads 241g and 242g in the Y direction. The length of the third external connection pad 243g in the X direction may be smaller than the length thereof in the Y direction.

According to embodiments, an area S1 of the first external connection pad 241g, an area S2 of the second external connection pad 242g, and an area S3 of the third external connection pad 243g may satisfy Equation 1 below.

$$0.95 \cdot S3 \leq (S1+S2) \leq 1.2 \cdot S3 \qquad \text{[Equation 1]}$$

According to embodiments, the first to third external connection pads 241g, 242g, and 243g having an area relationship of Equation 1 may be provided, thereby relieving stress applied to each of corners of the first to third external connection pads 241g, 242g, and 243g spaced farthest from the center 201C of the package substrate 201 by about 20% or more. Accordingly, the reliability of the LED package 200g may be improved.

Figure 3H:
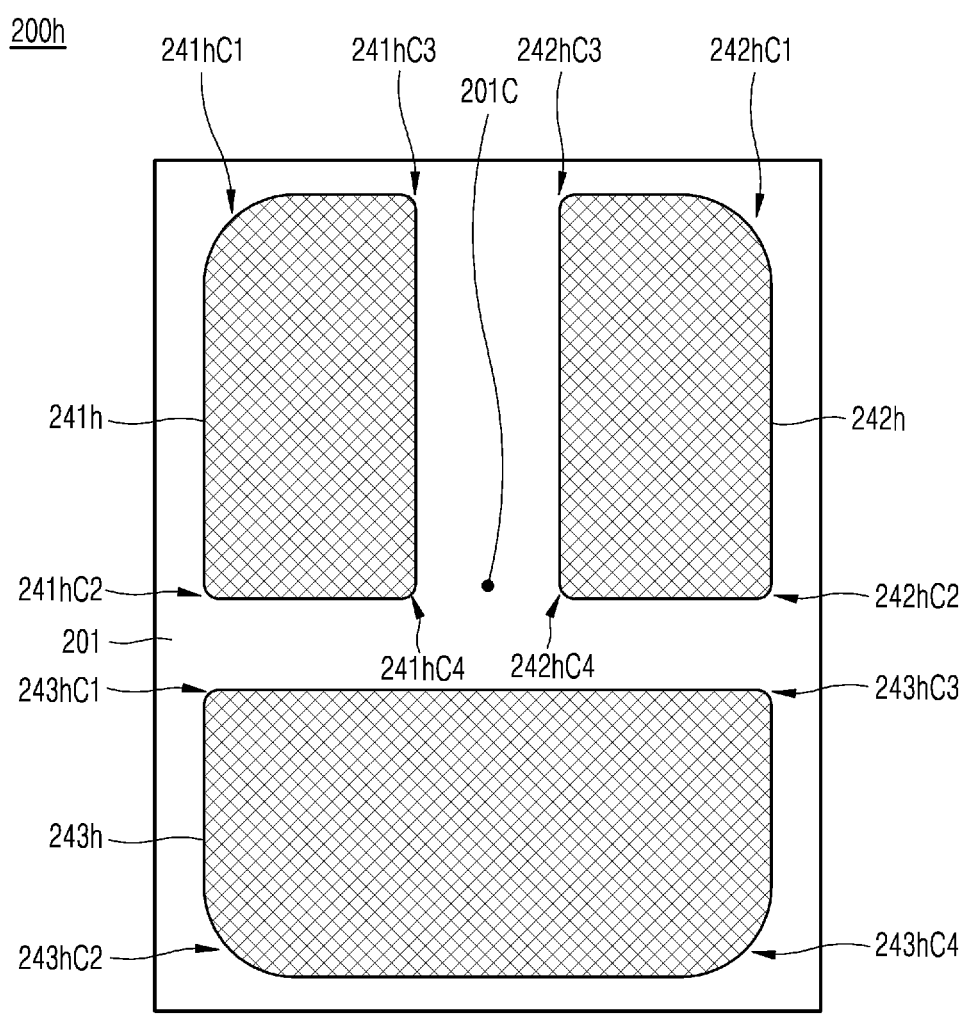

FIG. 3H is a plan view illustrating an LED package 200h according to other embodiments.

For convenience of description, redundant descriptions with those described with reference to FIGS. 1A to 3A may be omitted, and differences will be mainly described.

Referring to FIG. 3H, the LED package 200h may include first, second and third external connection pads 241h, 242h and 243h formed on a lower surface of the package substrate 201. In addition, the LED package 200h may further include the package substrate 201, the LED chip 210, the encapsulant 220, and the side reflective layer 230 shown in FIG. 1B.

The LED package 200h may be a 3-pad package. One of first and second conductivity type semiconductor layers of the LED chip 210 (see FIG. 1B) may be connected to the first external connection pad 241h, and the other may be connected to the second external connection pad 242h. The third external connection pad 243h may be a heat dissipation pad. The third external connection pad 243h may be floated. The third external connection pad 243h may be insulated from each of the first and second conductivity type semiconductor layers of the LED chip 210 (see FIG. 1B).

According to embodiments, each of the first to third external connection pads 241h, 242h, and 243h may have a substantially rectangular planar shape. A length of each of the first and second external connection pads 241h and 242h in the X direction may be greater than a length of each of the first and second external connection pads 241h and 242h in the Y direction. The length of the third external connection pad 243h in the X direction may be smaller than the length of the third external connection pad 243h in the Y direction. The first to third external connection pads 241h, 242h, and 243h together may be symmetric to each other with respect to an axis passing through the center 201C of the lower surface of the package substrate 201 and parallel to the X direction.

According to embodiments, the first external connection pad 241h may include first to fourth corners 241hC1, 241hC2, 241hC3, and 241hC4, the second external connection pad 242h may include first to fourth corners 242hC1, 242hC2, 242hC3, and 242hC4, and the third external connection pad 243h may include first to fourth corners 243hC1, 243hC2, 243hC3, and 243hC4.

According to embodiments, the first corner 241hC1 of the first external connection pad 241h farthest from the center 201C of the package substrate 201, the first corner 242hC1 of the second external connection pad 242h, and the second and fourth corners 243hC2 and 243hC4 of the third external connection pad 243h may have relatively large radiuses compared to the other corners, like the first corner 242C1 of FIG. 2A. The size of a radius of each of the first corner 241hC1 of the first external connection pad 241h farthest from the center 201C of the package substrate 201, the first corner 242hC1 of the second external connection pad 242h, and the second and fourth corners 243hC2 and 243hC4 of the third external connection pad 243h is similar to that described with reference to FIG. 2A.

Figure 3I:
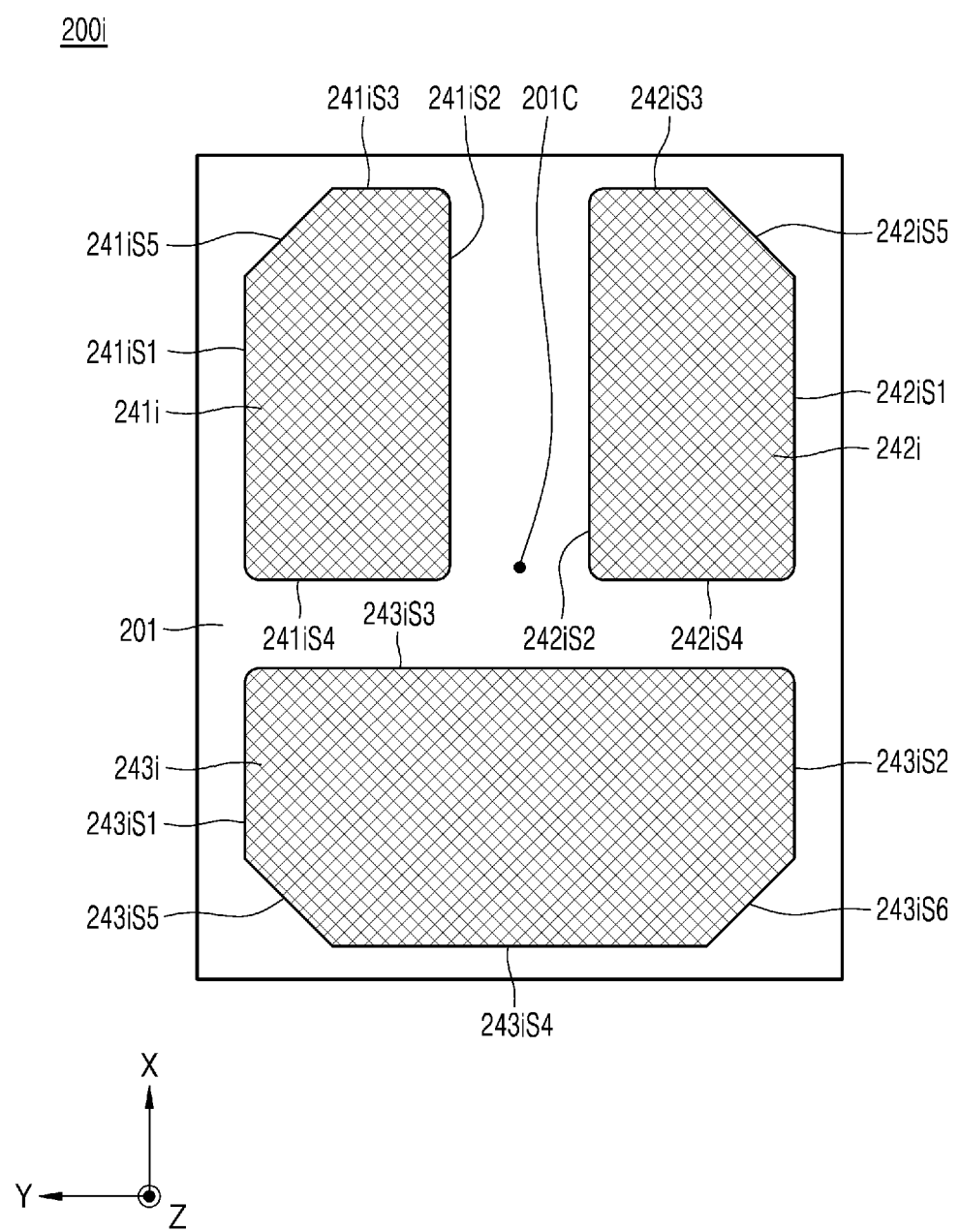

FIG. 3I is a plan view illustrating an LED package 200i according to other embodiments.

For convenience of description, redundant descriptions with those described with reference to FIGS. 1A to 3A may be omitted, and differences will be mainly described.

Referring to FIG. 3I, the LED package 200i may include first, second and third external connection pads 241i, 242i and 243i formed on a lower surface of the package substrate 201. In addition, the LED package 200i may further include the package substrate 201, the LED chip 210, the encapsulant 220, and the side reflective layer 230 shown in FIG. 1B.

The LED package 200i may be a 3-pad package. One of the first and second conductivity type semiconductor layers of the LED chip 210 (see FIG. 1B) may be connected to the first external connection pad 241i, and the other may be connected to the second external connection pad 242i. The third external connection pad 243i may be a heat dissipation pad. The third external connection pad 243i may be floated. The third external connection pad 243i may be insulated from each of the first and second conductivity type semiconductor layers of the LED chip 210 (see FIG. 1B).

A length of each of the first and second external connection pads 241i and 242i in the X direction may be greater than a length of each of the first and second external connection pads 241i and 242i in the Y direction. The length of the third external connection pad 243i in the X direction may be smaller than the length thereof in the Y direction. The first and second external connection pads 241i and 242i may be symmetric to each other with respect to an axis passing through the center 201C of the lower surface of the package substrate 201 and parallel to the X direction. The third external connection pad 243i may be symmetric with respect to an axis passing through the center 201C of the lower surface of the package substrate 201 and parallel to the X direction.

According to embodiments, the first external connection pad 241i may include first to fifth sides 241iS1, 241iS2, 241iS3, 241iS4, and 241iS5, the second external connection pad 242i may include first to fifth sides 242iS1, 242iS2, 242iS3, 242iS4, and 242iS5, and the third external connection pad 243i may include first to sixth sides 243iS1, 243iS2, 243iS3, 243iS4, 243iS5, and 243iS6.

Each of the first and second sides 241iS1, 241iS2, 242iS1, 242iS2, 243iS1, and 243iS2 may be parallel to the X direction, and each of the third and fourth sides 241iS3, 241iS4, 242iS3, 242iS4, 243iS3, 243iS4 may be parallel to the Y direction. Each of the fifth and sixth sides 241iS5, 242iS5, 243iS5, and 243iS6 may be oblique to the X and Y directions.

The first side 241iS1 may be shorter than the second side 241iS2, the first side 242iS1 may be shorter than the second side 242iS2, and the fourth side 243iS4 may be shorter than the third side 243iS3.

The fifth side 241iS5 may be interposed between the first and third sides 241iS1 and 241iS3 and may be connected to each of the first and third sides 241iS1 and 241iS3. The fifth side 242iS5 may be interposed between the first and third sides 242iS1 and 242iS3 and may be connected to each of the first and third sides 241iS1 and 241iS3. The fifth side 243iS5 may be interposed between the first and fourth sides 243iS1 and 243iS4, and may be connected to each of the first and fourth sides 243iS1 and 243iS4. The sixth side 243iS6 may be interposed between the second and fourth sides 243iS2 and 243iS4, and may be connected to each of the second and fourth sides 243iS2 and 243iS4.

According to embodiments, dimensional characteristics of the fifth and sixth sides 241iS5, 242iS52, 243iS5, and 243iS6 are similar to those described with respect to the fifth side 241aS5 with reference to FIG. 3A, and thus redundant descriptions thereof may be omitted.

Figure 3J:
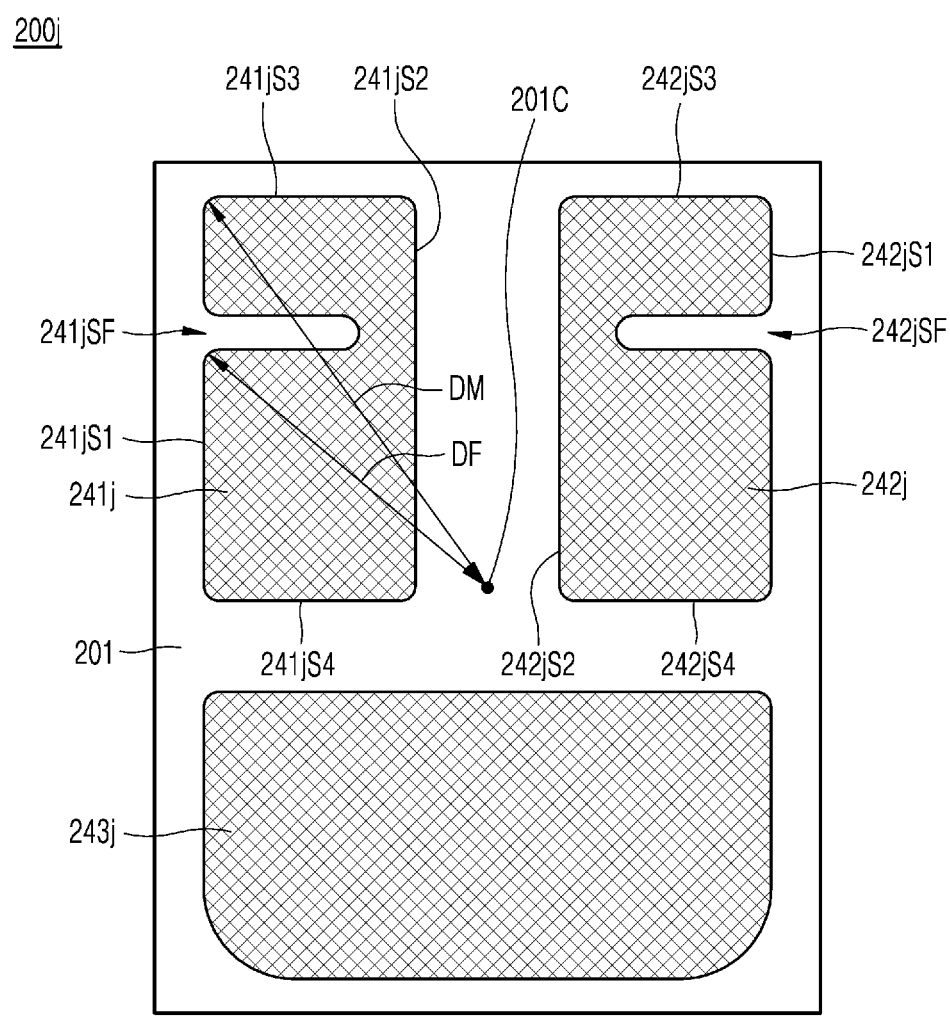

FIG. 3J is a plan view illustrating an LED package 200j according to other embodiments.

For convenience of description, redundant descriptions with those described with reference to FIGS. 1A to 3A may be omitted, and differences will be mainly described.

Referring to FIG. 3J, the LED package 200j may include first and second external connection pads 241j and 242j formed on a lower surface of the package substrate 201. In addition, the LED package 200j may further include the package substrate 201, the LED chip 210, the encapsulant 220, and the side reflective layer 230 shown in FIG. 1B.

The LED package 200j may be a 3-pad package. One of first and second conductivity type semiconductor layers of the LED chip 210 (see FIG. 1B) may be connected to the first external connection pad 241j, and the other may be connected to the second external connection pad 242j. The third external connection pad 243j may be a heat dissipation pad. The third external connection pad 243j may be floated. The third external connection pad 243j may be insulated from each of the first and second conductivity type semiconductor layers of the LED chip 210 (see FIG. 1B).

According to embodiments, each of the first to third external connection pads 241j, 242j, and 243j may have a substantially rectangular planar shape. A length of each of the first and second external connection pads 241j and 242j in the X direction may be greater than a length of each of the first and second external connection pads 241*j* and 242*j* in the Y direction. The length of the third external connection pad 243*j* in the X direction may be smaller than the length in the Y direction. The first to third external connection pads 241*j*, 242*j*, and 243*j* together may be symmetric to each other with respect to an axis passing through the center 201C of the lower surface of the package substrate 201 and parallel to the X direction.

According to embodiments, the first external connection pad 241*j* may include first to fourth sides 241*j*S1, 241*j*S2, 241*j*S3, and 241*j*S4, the second external connection pad 242*j* may include first to fourth sides 242*j*S1, 242*j*S2, 242*j*S3, and 242*j*S4, and the third external connection pad 243*j* may include first to fourth sides 243*j*S1, 243*j*S2, 243*j*S3, and 243*j* S4.

According to embodiments, a first stress relief finger 241*j* SF may be formed on the first side 241*j*S1, and a second stress relief finger 242*j* SF may be formed on the first side 242*j*S1. Dimensional and shape characteristics of the first and second stress relief fingers 241*j*SF and 242*j* SF are similar to those described with reference to FIG. 3D, and thus redundant descriptions thereof may be omitted.

The third external connection pad 243*j* may have substantially the same shape as the third external connection pad 243*h* of FIG. 3H.

Figure 4:
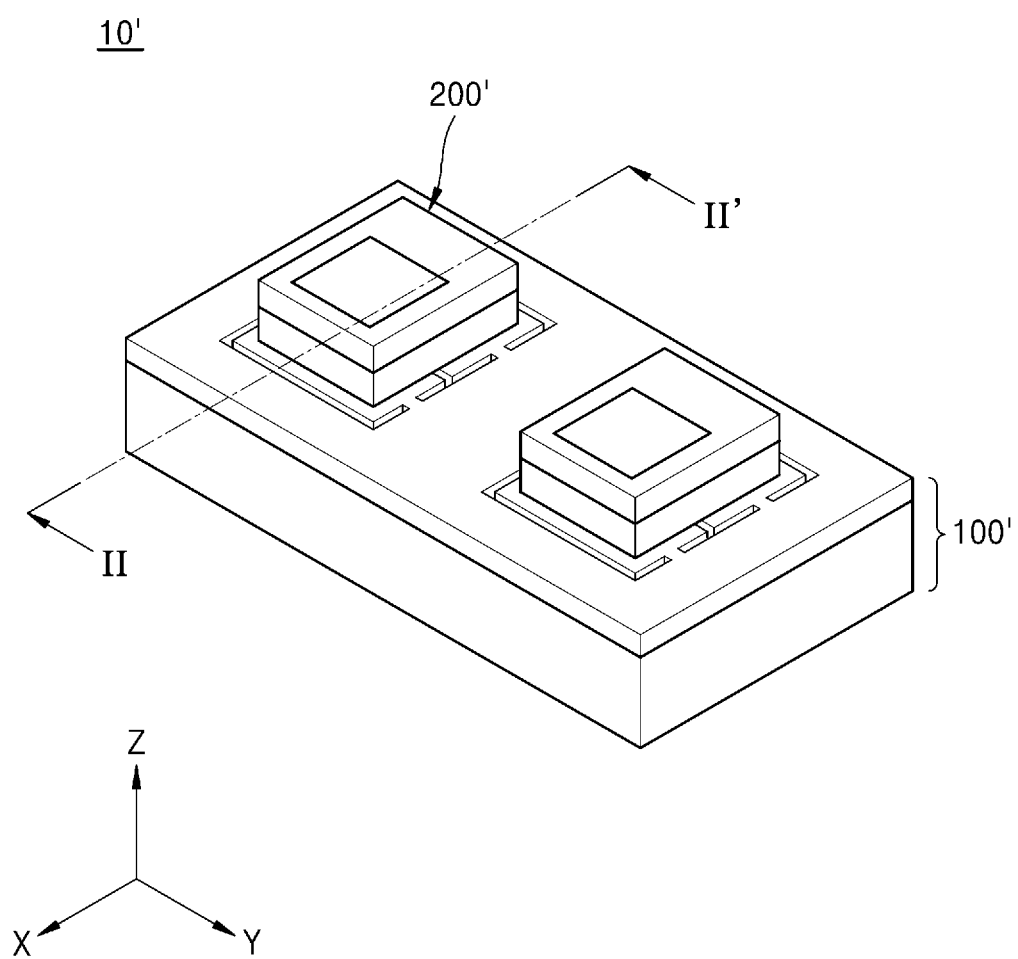
FIG. 4 is a perspective view of an illuminating device according to other embodiments.

FIG. 4 is a perspective view of an illuminating device 10' according to other embodiments.

Figure 5:
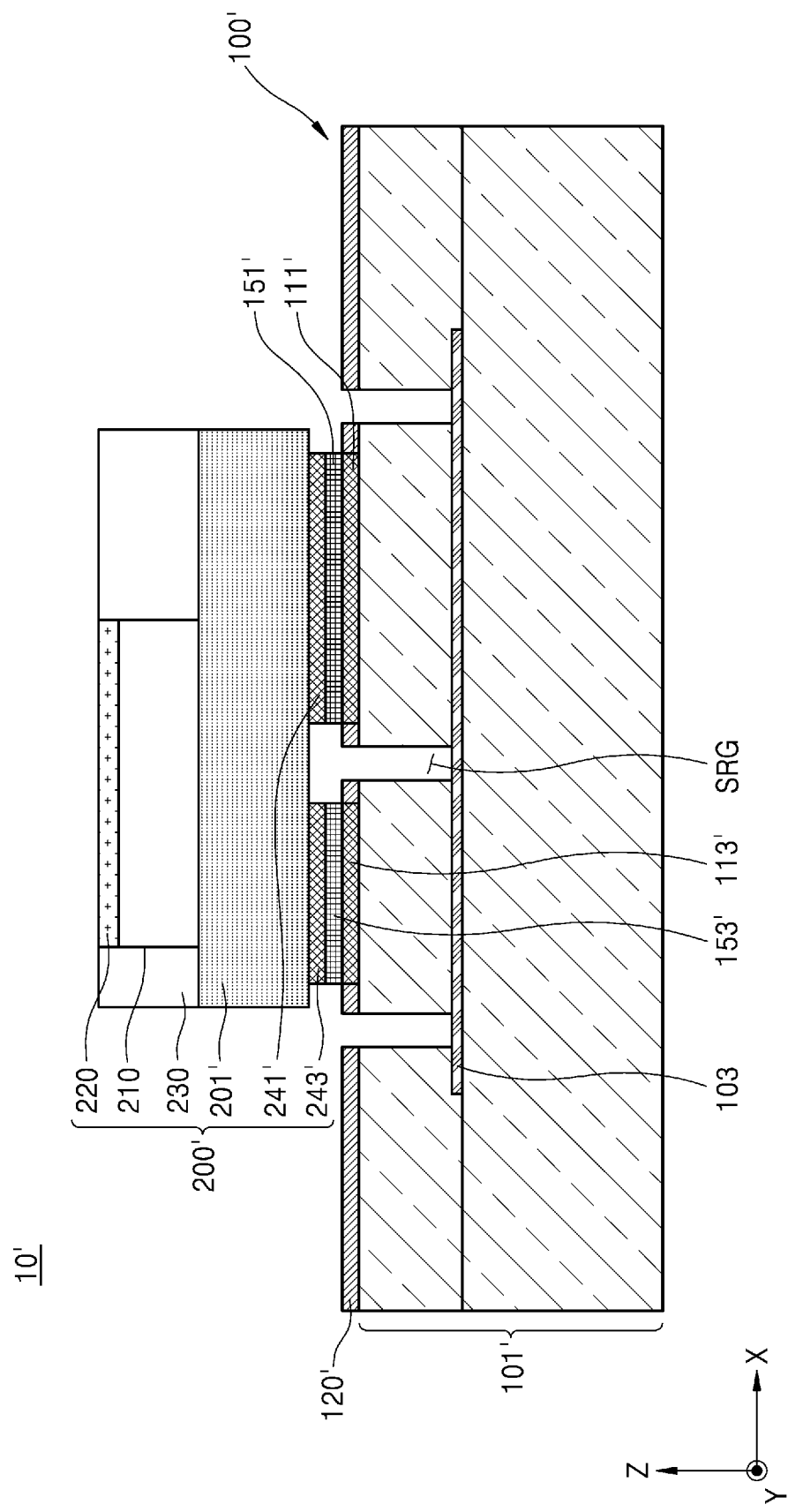
FIG. 5 is a cross-sectional view of the illuminating device taken along line II-II' of FIG. 4.

FIG. 5 is a cross-sectional view of the illuminating device 10' taken along line II-II' of FIG. 4.

Figure 6:
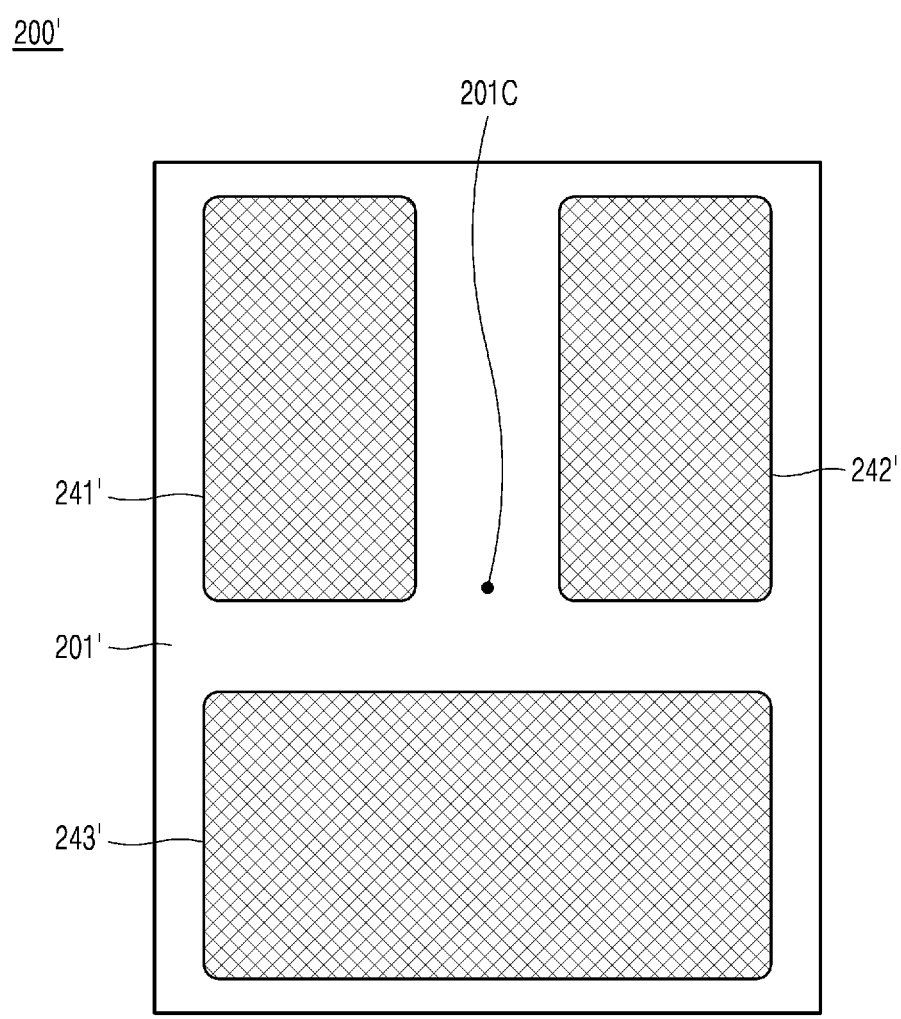
FIG. 6 is a plan view illustrating a lower surface of an LED package included in the illuminating device of FIG. 4.

FIG. 6 is a plan view illustrating a lower surface of an LED package 200' included in the illuminating device 10' of FIG. 4.

Figure 7:
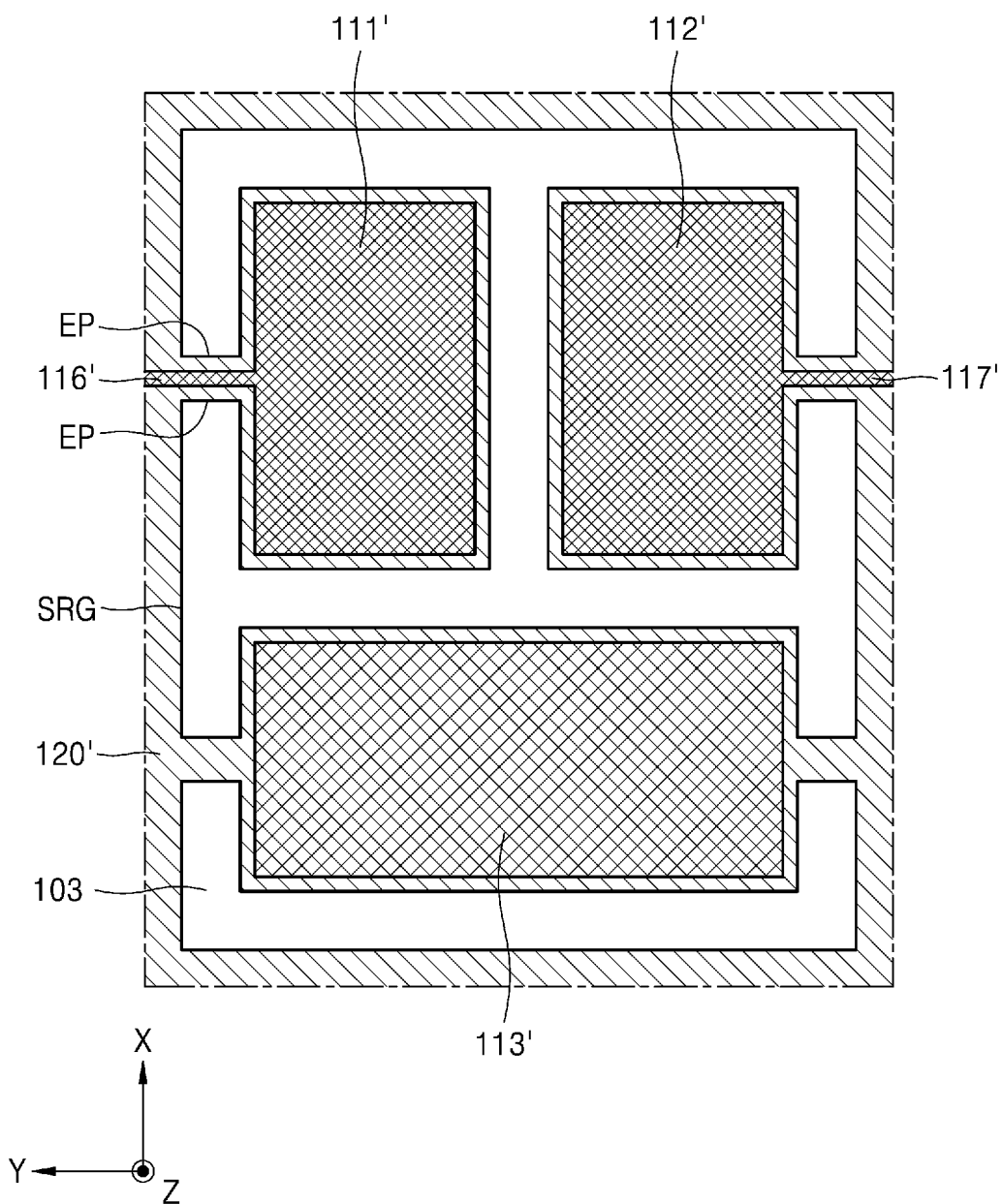
FIG. 7 is a partial plan view illustrating part of a PCB on which the LED package of FIG. 6 is mounted.

FIG. 7 is a partial plan view illustrating a part 100M' of a PCB 100' on which the LED package 200' of FIG. 6 is mounted.

For convenience of description, redundant descriptions with those described with reference to FIGS. 1A and 1B may be omitted, and differences will be mainly described.

Referring to FIGS. 4 to 6, as a non-limiting example, the illuminating device 10' may be a vehicle illuminating device similar to the illuminating device 10 of FIG. 1.

According to embodiments, the illuminating device 10' may include the PCB 100' and LED packages 200'.

The PCB 100' may include, for example, a substrate base 101' including aluminum, conductive patterns including first to third pads 111', 112', and 113' formed on the substrate base 101' and an insulating layer 120 surrounding the conductive patterns.

The substrate base 101' is similar to the substrate base 101 described with reference to FIGS. 1A and 1B, but may further include a stress relief groove SRG and a conductive plate 103.

The stress relief groove SRG may horizontally surround the first and second pads 111' and 112' in X and Y directions. The stress relief groove SRG may surround the first and second pads 111' and 112', excluding a part where a first connecter 116' is formed and a part where a second connecter 117' is formed. Accordingly, the first and second connectors 116' and 117' may be interposed between ends EP of the stress relief groove SRG.

The stress relief groove SRG may horizontally surround the third pad 113'. According to embodiments, the stress relief groove SRG may not completely surround the third pad 113' horizontally so that the substrate base 101' disposed below the third pad 113' is not completely separated.

The stress relief groove SRG may expose an upper surface of the conductive plate 103 disposed in the substrate base 101. The depth of the stress relief groove SRG in a Z direction may be in the range of about 35% to about 50% of the thickness of the substrate base 101'.

The conductive plate 103 may at least partially overlap the LED package 201' in the Z direction. In FIG. 3A, it is shown that one LED package 201' is provided on one conductive plate 103, but this is an example, and the scope of the inventive concept is not limited thereto. For example, two or more LED packages may be provided on one conductive plate.

According to embodiments, a conductive pattern including the first to third pads 111', 112', and 113' and the first and second connectors 116' and 117' may include conductive materials such as copper. The insulating layer 120' may include, for example, a photo-sensitive resist. One of a cathode and an anode of the LED package 200' may be connected to the first pad 111', and the other may be connected to the second pad 112'.

According to embodiments, the first and second pads 111' and 112' may provide a path for supplying operating power to the LED package 200'. According to embodiments, the first to third pads 111', 112', and 113' may provide a path for dissipating heat generated by the LED package 200.

A plurality of LED packages 200' may be mounted on the PCB 100'. The plurality of LED packages 200' may be fixed to and connected to the PCB 100' by a first solder 151', a second solder, and a third solder 153'. The first solder 151' may be connected to the first pad 111', the second solder may be connected to the second pad 112', and the third solder 153' may be connected to the third pad 113'.

Each of the LED packages 200' may be similar to the 3-pad LED package 200*g* shown in FIG. 3G. Each of the LED packages 200' may include the package substrate 201, the LED chip 210, the encapsulant 220, the side reflective layer 230, and first to third external connection pads 241', 242', and 243'. The shapes of the first to third external connection pads 241', 242' and 243' are sequentially similar to the shapes of the first to third external connection pads 241*g*, 242*g*, and 243*g* (see FIG. 3G).

The first external connection pad 241' may be connected to the first pad 111' through the first solder 151', the second external connection pad 242' may be connected to the second pad 112' through the second solder, and the third external connection pad 243' may be connected to the third pad 113' through the third solder 153'.

While the inventive concept has been shown and described with reference to embodiments thereof, it will be understood that various changes in form and details may be made therein without departing from the spirit and scope of the following claims.

What is claimed is:

1. A light-emitting diode (LED) package comprising:
   a package substrate;
   an LED chip disposed on a first surface of the package substrate; and
   a first external connection pad and a second external connection pad disposed on a second surface of the package substrate opposite the first surface,
   wherein the first external connection pad comprises a first side, a second side, a third side and a fourth side, the first side being parallel to the second side, and the third side being parallel to the fourth side,
   wherein the first side is spaced farther from a center of the package substrate than the second side, and wherein a length of the first side is shorter than a length of the second side.

2. The LED package of claim 1, wherein each of the length of the first side and the length of the second side is greater than a length of each of the third side and the fourth side.

3. The LED package of claim 1, wherein the first external connection pad comprises:
   a first corner connected to each of the first side and the third side; and
   a second corner connected to each of the second side and the third side, and wherein a radius of the first corner is larger than a radius of the second corner.

4. The LED package of claim 3, wherein the radius of the first corner is in a range of about 2 times to about 10 times the radius of the second corner.

5. The LED package of claim 3, wherein the radius of the first corner is in a range of about 0.2 times to about 0.5 times a distance between an intersection point where an extension line of the first side and an extension line of the third side intersect and the center of the package substrate.

6. The LED package of claim 1, further comprising a fifth side connected to each of the first side and the third side, the fifth side being oblique to the first side and the third side.

7. The LED package of claim 6, wherein each of a distance between an intersection point where an extension line of the first side and an extension line of the third side intersect and a first end of the fifth side and a distance between the intersection point and a second end of the fifth side is in a range of about 0.2 times to about 0.5 times a distance between the center of the package substrate and the intersection point.

8. The LED package of claim 1, wherein the first external connection pad further comprises a stress relief finger recessed from the first side toward the second side.

9. The LED package of claim 8, wherein a distance from the center of the package substrate to a starting point of the stress relief finger on the first side is in a range of about 0.5 times to about 0.8 times a distance between an intersection point where an extension line of the first side and an extension line of the third side intersect and the center of the package substrate.

10. The LED package of claim 1, wherein the first external connection pad is symmetric to the second external connection pad with respect to an axis passing through the center of the package substrate, the axis being parallel to the first side.

* * * * *